(12) United States Patent
Seo et al.

(10) Patent No.: US 9,793,309 B2
(45) Date of Patent: Oct. 17, 2017

(54) IMAGE SENSOR PACKAGE

(71) Applicant: Samsung Electronics Co., Ltd., Suwon-si, Gyeonggi-do (KR)

(72) Inventors: Byoung-rim Seo, Hwaseong-si (KR); Yoon-young Choi, Ansan-si (KR); Kyoung-sei Choi, Yongin-si (KR); Chang-soo Jin, Ansan-si (KR); Seung-kon Mok, Suwon-si (KR); Tae-weon Suh, Ansan-si (KR); Pyoung-wan Kim, Suwon-si (KR)

(73) Assignees: SAMSUNG ELECTRONICS CO., LTD. (KR); FUREX CO., LTD. (KR)

( * ) Notice: Subject to any disclaimer, the term of this patent is extended or adjusted under 35 U.S.C. 154(b) by 0 days.

(21) Appl. No.: 14/606,010

(22) Filed: Jan. 26, 2015

(65) Prior Publication Data

US 2015/0340397 A1 Nov. 26, 2015

(30) Foreign Application Priority Data

Feb. 20, 2014 (KR) ........................ 10-2014-0019694

(51) Int. Cl.
*H01L 31/0232* (2014.01)
*H01L 27/146* (2006.01)
*H01L 31/0203* (2014.01)

(52) U.S. Cl.
CPC .... *H01L 27/14627* (2013.01); *H01L 27/1462* (2013.01); *H01L 27/14618* (2013.01); *H01L 27/14623* (2013.01); *H01L 27/14636* (2013.01); *H01L 31/0203* (2013.01); *H01L 2224/13* (2013.01); *H01L 2224/48091* (2013.01); *H01L 2224/73265* (2013.01); *H01L 2224/8592* (2013.01); *H01L 2924/181* (2013.01)

(58) Field of Classification Search
CPC .......... H01L 27/14627; H01L 27/1462; H01L 27/14623
See application file for complete search history.

(56) References Cited

U.S. PATENT DOCUMENTS 6,285,064 B1 9/2001 Foster
6,534,340 B1 * 3/2003 Karpman .......... H01L 27/14618
257/E23.129

(Continued)

FOREIGN PATENT DOCUMENTS

JP 2010238888 A 10/2010
JP 2011035458 A 2/2011

*Primary Examiner* — Marc Armand
*Assistant Examiner* — Sarah Salerno
(74) *Attorney, Agent, or Firm* — Renaissance IP Law Group LLP

(57) ABSTRACT

Provided is an image sensor package that includes a transparent protection cover for protecting a plurality of unit pixels each including a microlens. The image sensor package includes a substrate which has a first surface and a second surface that are opposite to each other, and includes a sensor array region including a plurality of unit pixels formed in the first surface and a pad region including a pad arranged in the vicinity of the sensor array region, a plurality of microlenses formed on the plurality of unit pixels, respectively, at least two transparent material layers covering the plurality of microlenses, and a transparent protection cover attached onto the plurality of microlenses with the at least two transparent material layers interposed therebetween.

18 Claims, 17 Drawing Sheets

(56) References Cited

U.S. PATENT DOCUMENTS

| | | |
|---|---|---|
| 6,794,218 B2 | 9/2004 | Barton et al. |
| 6,906,403 B2 | 6/2005 | Bolken et al. |
| 6,934,065 B2 | 8/2005 | Kinsman |
| 7,033,664 B2 | 4/2006 | Zilber et al. |
| 7,265,402 B2 | 9/2007 | Koyanagi |
| 7,414,661 B2 | 8/2008 | Hartlove et al. |
| 7,535,509 B2 | 5/2009 | Takayama |
| 7,678,211 B2 | 3/2010 | Takasaki et al. |
| 7,723,741 B2 | 5/2010 | Farnworth et al. |
| 7,786,574 B2 | 8/2010 | Derderian et al. |
| 7,834,926 B2 | 11/2010 | Minamio et al. |
| 7,939,918 B2 | 5/2011 | Badehi |
| 7,989,909 B2 | 8/2011 | Kim |
| 8,093,092 B2 | 1/2012 | Singh et al. |
| 2002/0045285 A1* | 4/2002 | Ushijima ................. G02B 1/02 |
| | | 438/29 |
| 2006/0051890 A1 | 3/2006 | Bolken et al. |
| 2006/0267169 A1 | 11/2006 | Bolken et al. |
| 2007/0030380 A1* | 2/2007 | Higuchi ............ H01L 27/14625 |
| | | 348/340 |
| 2007/0117349 A1* | 5/2007 | Komatsu ........... H01L 27/14603 |
| | | 438/459 |
| 2008/0073736 A1* | 3/2008 | Hwang ............... H01L 27/1462 |
| | | 257/432 |
| 2008/0303107 A1* | 12/2008 | Minamio .......... H01L 27/14618 |
| | | 257/432 |
| 2012/0325402 A1 | 12/2012 | Suwa et al. |
| 2013/0098548 A1 | 4/2013 | Chen |

\* cited by examiner

IMAGE SENSOR PACKAGE

CROSS-REFERENCE TO RELATED APPLICATION

This application claims priority to Korean Patent Application No. 10-2014-0019694, filed on Feb. 20, 2014, in the Korean Intellectual Property Office, the disclosure of which is incorporated herein in its entirety by reference.

BACKGROUND

The inventive concept relates to an image sensor package, and more particularly, to an image sensor package that includes a transparent protection cover.

Image sensors, which capture an image of a subject and convert the image into an electrical signal, are used not only for electronic devices for general consumers such as a digital camera, a mobile phone camera, and a portable camcorder but also for cameras installed in cars, security devices, and robots. The image sensor includes a plurality of unit pixels each including a microlens.

SUMMARY

The inventive concept provides an image sensor package that includes a transparent protection cover for protecting a plurality of unit pixels each including a microlens and transmits incident light to the plurality of unit pixels without distortion.

According to an aspect of the inventive concept, there is provided an image sensor package comprising a substrate which has a first surface and a second surface that are opposite to each other, and comprises a sensor array region including a plurality of unit pixels formed in the first surface and a pad region including a pad arranged in a vicinity of the sensor array region, a plurality of microlenses formed on the plurality of unit pixels, respectively, at least two transparent material layers covering the plurality of microlenses, and a transparent protection cover attached onto the plurality of microlenses with the at least two transparent material layers interposed therebetween.

The at least two transparent material layers may fill a space between the sensor array region of the substrate and the transparent protection cover.

The transparent protection cover may overlap the sensor array region in a direction substantially perpendicular to the first surface of the substrate and exposes the pad.

At least one of the at least two transparent material layers may cover the pad.

One of the at least two transparent material layers may expose at least a portion of the pad in a direction substantially perpendicular to the first surface of the substrate.

The image sensor package further may comprise a package base substrate, wherein the substrate may be attached onto the package base substrate.

The package base substrate may have an upper surface that defines a recess, and the substrate is attached to the inside of the recess.

The first surface of the substrate may have a level which is lower than that of an uppermost surface of the package base substrate.

The image sensor package further may comprise a bonding wire connecting the pad to the package base substrate; and an opaque resin layer surrounding the bonding wire and covering lateral sides of the substrate and the transparent protection cover.

The image sensor package further may comprise a through electrode which is electrically connected to the pad and passes through the substrate to be exposed by the second surface of the substrate, wherein the substrate and the transparent protection cover may have the same area and overlap each other in a direction substantially perpendicular to the first surface of the substrate.

An infrared shielding film may be formed on a lower surface of the transparent protection cover.

According to another aspect of the inventive concept, there is provided an image sensor package comprising a package base substrate, a substrate which has a first surface and a second surface that are opposite to each other, comprises a sensor array region including a plurality of unit pixels formed in the first surface and a pad region including a pad arranged in a vicinity of the sensor array region, and is attached onto the package base substrate so that the second surface faces the package base substrate, a plurality of microlenses formed on the plurality of unit pixels, respectively, a first transparent material layer covering the substrate and exposing at least a portion of the pad, a second transparent material layer formed on the first transparent material layer, and a transparent protection cover which is attached onto the first transparent material layer with the second transparent material layer interposed therebetween, covers the entire sensor array region in a direction substantially perpendicular to the first surface of the substrate, and exposes the pad.

The second transparent material layer has a refractive index which may be smaller than those of the first transparent material layer and the transparent protection cover.

The package base substrate may have an upper surface that defines a recess, and wherein the substrate may be attached to the inside of the recess so that the first surface of the substrate is positioned within the recess.

The image sensor package further may comprise an opaque resin layer that may cover lateral sides of the substrate and the transparent protection cover and fill the recess.

According to an embodiment, an image sensor package comprises a package base substrate, a substrate having a first surface and a second surface which are opposite to each other, the substrate including a sensor array region comprising a plurality of unit pixels formed in the first surface and a pad region comprising a pad arranged in the vicinity of the sensor array region, and the substrate attached onto the package base substrate so that the second surface faces the package base substrate, a plurality of microlenses formed on the plurality of unit pixels, respectively, a first transparent material layer formed on the substrate to cover the plurality of microlenses and the pad, a second transparent material layer formed on the first transparent material layer so as not to cover the pad in a direction substantially perpendicular to the first surface of the substrate, and a transparent protection cover covering the sensor array region in a direction substantially perpendicular to the first surface of the substrate with the first and second transparent material layers interposed therebetween.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
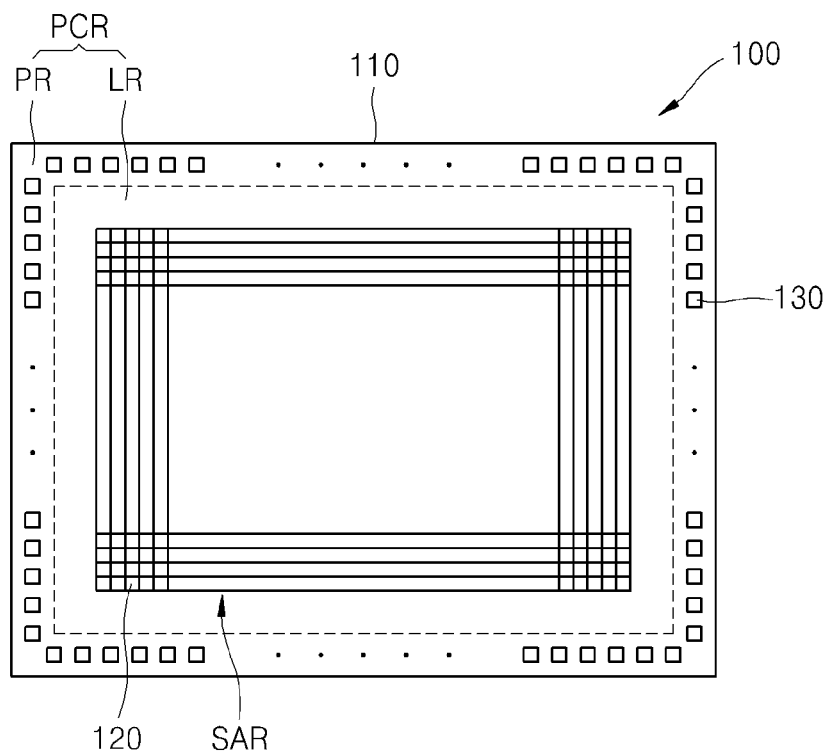
FIG. 1 is a planar configuration diagram of an image sensor according to an embodiment of the inventive concept.

The inventive concept will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers and regions are exaggerated for clarity.

It will be understood that when an element is referred to as being "connected to", or "contacting" another element throughout the specification, it can be directly "connected to" or "contacting" the other element, or intervening elements may also be present. Other words used to describe the relationship between elements should be interpreted in a like fashion (e.g., "between," versus "directly between," "adjacent," versus "directly adjacent," etc.).

In the present description, terms such as 'first', 'second', etc. are used to describe various elements. However, it is obvious that the elements should not be defined by these terms. The terms are used only for distinguishing one element from another element. For example, a first element which could be termed a second element, and similarly, a second element may be termed a first element, without departing from the teaching of the inventive concept.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. As used herein, the term "and/or" includes any and all combinations of one or more of the associated listed items. Expressions such as "at least one of," when preceding a list of elements, modify the entire list of elements and do not modify the individual elements of the list.

FIG. 1 is a planar configuration diagram of an image sensor according to an embodiment of the inventive concept.

Referring to FIG. 1, an image sensor chip 100 may include a sensor array region SAR, a logic region LR, and a pad region PR which are formed in a semiconductor substrate 110.

The semiconductor substrate 110 may include, for example, silicon (Si). In an embodiment, the semiconductor substrate 110 may include a semiconductor element such as germanium (Ge) or a compound semiconductor such as silicon carbide (SiC), gallium arsenide (GaAs), indium arsenide (InAs), and indium phosphide (InP). In an embodiment, the semiconductor substrate 110 may include a silicon on insulator (SOI) structure or a buried oxide layer (BOX) layer. The semiconductor substrate 110 may include a conductive region, for example, a well doped with impurities or a structure doped with impurities. In an embodiment, the semiconductor substrate 110 may have various device isolation structures such as a shallow trench isolation (STI) structure.

The image sensor chip 100 may be, for example, a CMOS image sensor (CIS) or a charge-coupled device (CCD).

The sensor array region SAR includes a plurality of unit pixels 120 that are arranged in a matrix. The logic region LR may be positioned along edges of the sensor array region SAR. Although the logic region LR is shown to be positioned along all the four edges of the sensor array region SAR, the inventive concept is not limited thereto. The logic region LR may be positioned along two or three of the edges of the sensor array region SAR.

The logic region LR includes electronic devices each including a plurality of transistors, and provides a uniform signal to each of the unit pixels 120 or controls an output signal. For example, the logic region LR may include a timing generator, a row decoder, a row driver, a correlated double sampler (CDS), an analog to digital converter (ADC), a latch unit, a column decoder 128, and the like.

The plurality of unit pixels 120 included in the sensor array region SAR may be driven by receiving a plurality of driving signals such as a row selection signal, a reset signal, and a charge transmission signal from the row driver. In addition, an electrical output signal which is photoelectrically converted by the plurality of unit pixels 120 may be provided to the correlated double sampler. The timing generator may provide a timing signal and a control signal to the row decoder and the column decoder. The row driver may provide a plurality of driving signals for driving the plurality of unit pixels 120 according to results of the decoding of the row decoder, and may provide the driving signal for each row of the matrix when the plurality of unit pixels 120 are arranged in a matrix. The correlated double sampler may receive the output signal from the plurality of unit pixels 120, and may maintain and sample the output signal. That is, the correlated double sampler may doubly sample a specific noise level and a signal level according to the output signal, and may output a difference level corresponding to a difference between the noise level and the signal level. The analog to digital converter may convert an analog signal corresponding to the difference level into a digital signal, and may output the converted signal. The latch unit latches a digital signal, and the latched signal may be sequentially output according to results of the decoding of the column decoder.

For example, the unit pixel 120 may be a passive pixel sensor or an active pixel sensor. For example, the unit pixel 120 may include a photodiode that senses light, a transfer transistor that transfers charge generated by a photodiode, a reset transistor that periodically resets a floating diffusion region for storing the transferred charge, and a source follower that buffers a signal according to charge which is charged in the floating diffusion region.

The pad region PR includes a plurality of pads 130 used to transmit and receive an electrical signal to and from an external device or a package base substrate. The pad region PR is disposed in the vicinity of the sensor array region SAR. The plurality of pads 130 formed in the pad region PR are electrically connected to the unit pixel 120 and are disposed along the edge of the sensor array region SAR. The plurality of pads 130 may be formed of, for example, a metal, a metal nitride, or a combination thereof. A conductive wiring and a conductive plug for electrically connecting the plurality of pads 130, the electronic device included in the logic region LR, and the plurality of unit pixels 120 included in the sensor array region SAR are formed in the substrate 110. The conductive wiring and the conductive plug may be formed of, for example, a metal, a metal nitride, or a combination thereof.

The logic region LR and the pad region PR may be collectively referred to as a peripheral circuit region PCR, and the peripheral circuit region PCR means a region other than the sensor array region SAR in the substrate 110 constituting the image sensor chip 100.

Figure 2:
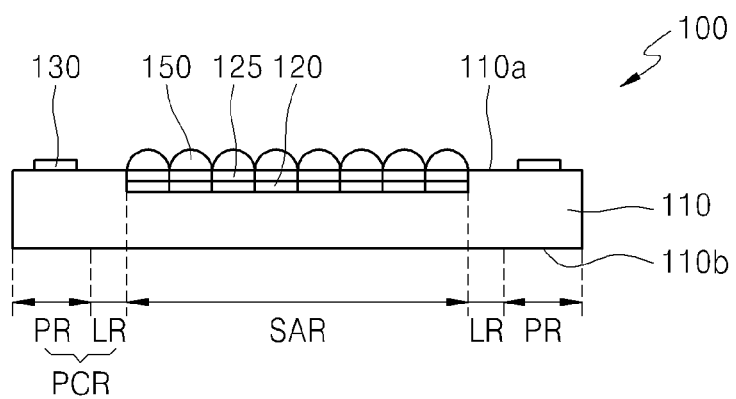
FIG. 2 is a cross-sectional configuration diagram of an image sensor according to an embodiment of the inventive concept.

FIG. 2 is a cross-sectional configuration diagram of an image sensor according to an embodiment of the inventive concept.

Referring to FIG. 2, an image sensor chip 100 may include a sensor array region SAR, a logic region LR, and a pad region PR which are formed in a semiconductor substrate 110. The semiconductor substrate 110 has a first surface 110a and a second surface 110b which are opposed to each other. The first surface 110a and the second surface 110b of the semiconductor substrate 110 may also be referred to as an upper surface 110a and a lower surface 110b of the semiconductor substrate 110, respectively.

The sensor array region SAR includes a plurality of unit pixels 120 which are arranged in a matrix. The plurality of unit pixels 120 and a plurality of pads 130 may be formed in the first surface 110a of the semiconductor substrate 110. A plurality of color filters 125 and a plurality of microlenses 150 are formed in order on the plurality of unit pixels 120.

For example, the plurality of color filters 125 may include red (R), blue (B), and green (G) filters. Alternatively, the plurality of color filters 125 may include cyan (C), yellow (Y), and magenta (M) filters. One color filter 125 among R, B, and G filters and one color filter 125 among C, Y, and M filters are formed on each of the unit pixels 120 so that each unit pixel 120 may sense components of separated incident light and may recognize one color.

The plurality of microlenses 150 may condense incident light of the sensor array region SAR onto the unit pixel 120. When the unit pixel 120 includes a photodiode, the plurality of microlenses 150 may condense the incident light of the sensor array region SAR onto the photodiode of the unit pixel 120. The microlens 150 may be formed of, for example, a TMR-based resin (product manufactured by Tokyo Ohka Kogyo, Co.) or an MFR-based resin (product manufactured by Japan Synthetic Rubber Corporation).

FIGS. 3 to 10 are cross-sectional views showing aspects of an image sensor package according to an embodiment of the inventive concept. Hereinafter, for convenience of illustration, only the substrate 110, the unit pixels 120, the pads 130, and the microlenses 150 are shown as components of the image sensor chip 100, and omitted components among the components described in FIGS. 1 and 2 may be cited and described when necessary. Unless mentioned otherwise, a region of the substrate 110 on which the pads 130 are formed may correspond to the pad region PR described in FIGS. 1 and 2.

Figure 3:
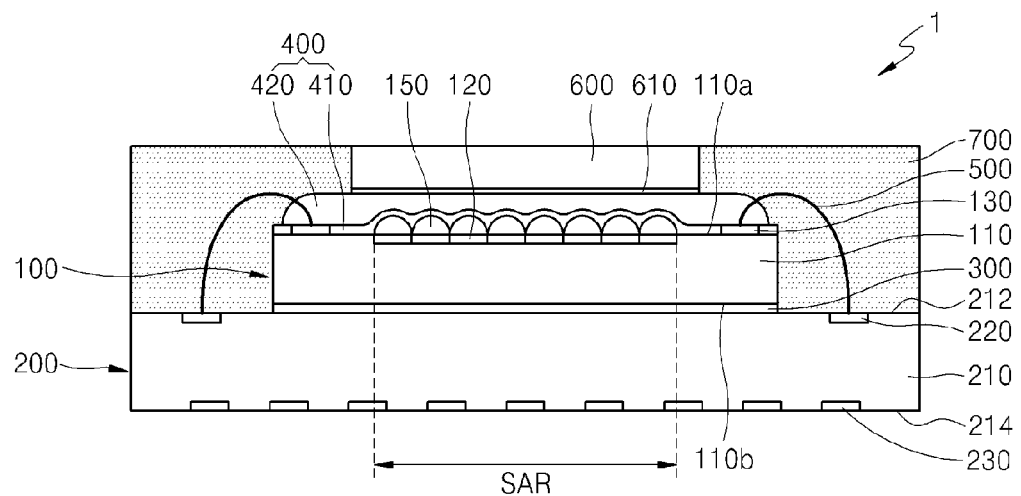
FIGS. 3 to 10 are cross-sectional views of an image sensor package according to an embodiment of the inventive concept.

FIG. 3 is a cross-sectional view showing an aspect of an image sensor package 1 according to an embodiment of the inventive concept.

Referring to FIG. 3, the image sensor package 1 includes a package base substrate 200, the image sensor chip 100, and a transparent protection cover 600. The image sensor package 1 may be formed by attaching the substrate 110 constituting the image sensor chip 100 onto the package base substrate 200 and then attaching the transparent protection cover 600 onto the image sensor chip 100.

The image sensor chip 100 may be attached onto the package base substrate 200 through a die adhesive film 300. The die adhesive film 300 may be formed in a B-stage state. Here, the B-stage state means a state where a solvent is removed in an A-stage state which is an initial reaction stage of a thermosetting resin, whereas hardening does not proceed. The B-stage state also means a state which is not melted and swells by a solvent, but is not dissolved. Accordingly, the A-stage state generally transitions to the B-stage state through heat treatment. The B-stage state may have an adhesive property. For reference, the C-stage state means a state where hardening is completed.

The image sensor chip 100 is provided with the plurality of unit pixels 120 formed in the sensor array region SAR of the substrate 110 and includes the plurality of microlenses 150 formed on the plurality of unit pixels 120, respectively. A transparent material layer 400 is formed on the plurality of microlenses 150 to cover the plurality of microlenses 150. The transparent protection cover 600 is attached onto the plurality of microlenses 150 with the transparent material layer 400 interposed therebetween. The transparent material layer 400 may function as an adhesive for attaching the transparent protection cover 600 onto the microlenses 150 of the image sensor chip 100. The transparent material layer 400 may include at least two transparent material layers, for example, a first transparent material layer 410 and a second transparent material layer 420. The transparent material layer 400 may fill a space between the sensor array region SAR of the substrate 110 and the transparent protection cover 600. The first transparent material layer 410 of the transparent material layer 400 may expose at least a portion of the pads 130, and the second transparent material layer 420 may cover all or some of the pads 130. That is, the first transparent material layer 410 may not overlap some or all of the pads 130 in a direction perpendicular to the first surface 110a of the substrate 110 so as to be capable of exposing at least a portion of the pads 130. The second transparent material layer 420 may not overlap some or all of the pads 130 in a direction perpendicular to the first surface 110a of the substrate 110 to be capable of covering some or all of the pads 130.

For example, the first transparent material layer 410 may be formed by coating the first surface 110a of the substrate 110 with a transparent material by using a spin coating method and then removing a portion of the transparent material which is formed on the pads 130 in the transparent material applied so as to expose at least a portion of the pads 130. The first transparent material layer 410 may have a difference in level in the upper surface thereof. That is, the first transparent material layer 410 may be formed on the upper surfaces of the plurality of microlenses 150 in a conformal manner, and thus may have a difference in level which is formed by transfer of the differences in level of the upper surfaces of the plurality of microlenses 150. In an embodiment, the first transparent material layer 410 has a difference in level in the upper surface thereof, but may have a difference in level which is relatively lower than the differences in level of the upper surfaces of the plurality of microlenses 150. That is, the first transparent material layer 410 fills some of spaces between the plurality of microlenses 150 to thereby reduce the difference in level due to the plurality of microlenses 150.

The second transparent material layer 420 may be formed on the image sensor chip 100 on which the first transparent material layer 410 is formed, by using a dispensing method. The second transparent material layer 420 may have a round upper surface by surface tension after being dispensed onto the first transparent material layer 410. Thereafter, the second transparent material layer 420 may have a flat upper surface which contacts a lower surface of the transparent protection cover 600 by the attachment of the transparent protection cover 600 onto the second transparent material layer 420.

The transparent protection cover 600 may overlap the sensor array region SAR in a direction perpendicular to the first surface 110a of the substrate 110 and may expose the pads 130. That is, the transparent protection cover 600 may cover the entire sensor array region SAR to overlap all the plurality of unit pixels 120 in a direction perpendicular to the first surface 110a of the substrate 110 and may not cover the pads 130 so as not to overlap the pads 130. An infrared shielding film 610 may be formed on the lower surface of the transparent protection cover 600. For example, the infrared shielding film 610 may have a multi-layered structure in which two types of thin material layers are repeatedly laminated. For example, the infrared shielding film 610 may be formed by repeatedly laminating several tens of $SiO_2$ and $TiO_2$ layers. The infrared shielding film 610 may be formed in advance before the transparent protection cover 600 is attached onto the image sensor chip 100. The infrared shielding film 610 may prevent infrared rays from being incident on the plurality of unit pixels 120 of the image sensor chip 100. The image sensor package 1 according to the inventive concept may prevent diffused reflection of incident light, and thus an antireflection film may not be separately formed on the upper surface or the lower surface of the transparent protection cover 600, thereby allowing manufacturing costs of the transparent protection cover 600 to be reduced.

The package base substrate 200 may include a base portion 210, and a plurality of upper pads 220 and a plurality of lower pads 230 which are formed in an upper surface 212 and a lower surface 214 of the base portion 210, respectively. The package base substrate 200 may be, for example, a printed circuit board (PCB) or a ceramic substrate.

The base portion 210 may include an epoxy resin, a polyimide resin, a bismaleimide triazine (BT) resin, flame retardant 4 (FR-4), FR-5, ceramic, silicon, or glass. However, these are merely examples, and the inventive concept is not limited thereto. The base portion 210 may have a single-layered structure or a multi-layered structure including wiring patterns therein. For example, the base portion 210 may be configured as one rigid flat plate, or may be formed by attaching a plurality of rigid flat plates to each other or by attaching a thin flexible PCB to a rigid flat plate. Each of the plurality of rigid flat plates or PCBs which are attached to each other may include a wiring pattern. In an embodiment, the base portion 210 may be a low temperature co-fired ceramic (LTCC) substrate. The LTCC substrate may include a plurality of ceramic layers laminated on each other, and each of the ceramic layers may include a wiring pattern. The upper pads 220 and the lower pads 230 may be electrically connected to each other by the wiring patterns which are included in the base portion 210. The wiring pattern, the upper pad 220, or the lower pad 230 may be formed of, for example, a metal material such as copper (Cu), or may be formed by partially plating a pattern formed of a metal material such as Cu with another material such as nickel (Ni) or gold (Au).

The image sensor package 1 may include a bonding wire 500 that connect the pads 130 of the image sensor chip 100 and the upper pads 220 of the package base substrate 200. The bonding wire 500 may electrically connect the image sensor chip 100 and the package base substrate 200. The second transparent material layer 420 covering the pad 130 may cover a portion of the bonding wire 500, for example, a portion of the bonding wire 500 which contacts the pads 130.

The image sensor package 1 may further include an opaque resin layer 700 on the package base substrate 200. The opaque resin layer 700 may surround the bonding wire 500 and may cover lateral sides of the substrate 110 and the transparent protection cover 600. The opaque resin layer 700 may cover all the remaining portions of the bonding wire 500 which are not covered with the second transparent material layer 420. Accordingly, the bonding wire 500 may be entirely covered with the second transparent material layer 420 and the opaque resin layer 700. The opaque resin layer 700 may cover all the entire lateral side of the substrate 110. The opaque resin layer 700 may cover the entirety or a portion of the lateral side of the transparent protection cover 600, but may expose the entire upper surface of the transparent protection cover 600. Although FIG. 3 shows that the opaque resin layer 700 covers the entire lateral side of the transparent protection cover 600, the opaque resin layer 700 may cover a relatively large area of the lateral side of the transparent protection cover 600 and may expose a relatively small area on the upper side of the lateral side of the transparent protection cover 600. The opaque resin layer 700 may prevent light from being incident through the lateral side of the transparent protection cover 600.

The opaque resin layer 700 may cover the entirety or a portion of the upper surface 212 which is exposed in the vicinity of the image sensor chip 100 in the upper surface 212 of the package base substrate 200, and may cover the upper pads 220 of the package base substrate 200 and the bonding wire 500. The opaque resin layer 700 may be formed of, for example, an epoxy molding compound (EMC). The opaque resin layer 700 may be formed using a mold, or may be formed by dispensing a resin material onto the lateral sides of the transparent protection cover 600 and the substrate 110.

The microlens 150 may be formed of, for example, an acrylic-based material, and may have a refractive index of 1.5 to 1.6. The first transparent material layer 410 may be formed of, for example, an acrylic-based or silicon-based material, and may have a refractive index of 1.5 to 1.6 which is similar to that of the microlens 150. For example, the second transparent material layer 420 may have a refractive index of 1.4 to 1.5. The transparent protection cover 600 may be formed of, for example, glass, transparent plastic, or quartz, and may have a refractive index of 1.5 to 1.6 which is similar to or slightly smaller than that of the microlens 150. The second transparent material layer 420 may have a refractive index which is smaller than that of the first transparent material layer 410. In an embodiment, the second transparent material layer 420 may have a refractive index which is smaller than that of the transparent protection cover 600. The second transparent material layer 420 may have a refractive index which is smaller than that of the microlens 150.

The image sensor chip 100 included in the image sensor package 1 may be surrounded by the transparent material layer 400 and the opaque resin layer 700. Since the image sensor chip 100, in particular, the entire space between the image sensor chip 100 and the transparent protection cover 600 is filled with the transparent material layer 400, a space filled with gas such as air may not be present within the image sensor package 1. The gas such as air may expand relatively largely by heat. Accordingly, when gas such as air is filled in the space between the image sensor chip 100 and the transparent protection cover 600, the gas such as air thermally expanding by heat generated when the image sensor package 1 operates or by heat due to an environment may damage the image sensor package 1. However, the image sensor package 1 according to the inventive concept may fill the space between the image sensor chip 100 and the transparent protection cover 600 with the transparent material layer 400, and thus thermal expansion does not occur.

In the image sensor package 1 according to the inventive concept, since the transparent material layer 400 having a refractive index which is greater than that of air (for example, having a refractive index of approximately 1) is filled in the space between the image sensor chip 100 and the transparent protection cover 600, there is a small difference in refractive index between the transparent protection cover 600 and the microlens 150. Accordingly, the generation of diffused reflection is suppressed, and thus a flare phenomenon may not occur.

When gas such as air is present in the image sensor package, light incident on each unit pixel may be distorted due to particles having mobility which may be included in gas such as air. However, since the image sensor package 1 according to an embodiment of the inventive concept is filled with the transparent material layer 400, there is no particle having mobility between the image sensor chip 100 and the transparent protection cover 600, and thus light incident on each unit pixel 120 may not be distorted.

The first transparent material layer 410 may have a refractive index which is the equal or similar to that of the microlens 150, and may reduce differences in level of the upper surfaces of the plurality of microlenses 150. Accordingly, it is possible to prevent diffused reflection of incident light from occurring due to the differences in level of the upper surfaces of the plurality of microlenses 150.

The second transparent material layer 420 has a refractive index which is smaller than those of the first transparent material layer 410 and the transparent protection cover 600, and thus it is possible to relatively reduce the reflection of light incident on the first transparent material layer 410 from the second transparent material layer 420 at a boundary between the first transparent material layer 410 and the second transparent material layer 420. In addition, it is possible to reduce the reflection of light, which is reflected at the boundary between the first transparent material layer 410 from the second transparent material layer 420, at a boundary between the second transparent material layer 420 and the transparent protection cover 600. Thus, it is possible to prevent light from being repeatedly reflected between the microlens 150 and the transparent protection cover 600. Accordingly, it is possible to prevent the diffused reflection of light between the microlens 150 and the transparent protection cover 600 and to increase the amount of incident light transmitted to each unit pixel 120, thereby allowing sensitivity of the image sensor package to be increased.

Since the transparent material layer 400 may function as an adhesive for attaching the transparent protection cover 600, a separate adhesion region for attaching the transparent protection cover 600 is not required to be formed in the vicinity of the sensor array region SAR. Accordingly, it is possible to minimize the size of the transparent protection cover 600 and to minimize the distance between the sensor array region SAR and the pad 130, and thus the size of the image sensor chip 100 may be reduced, which leads to a reduction in the size of the image sensor package 1. In addition, since the transparent protection cover 600 may be attached onto the image sensor chip 100 using the entire area of the sensor array region SAR, the transparent protection cover 600 may be stably attached onto the image sensor chip 100.

At least one of the transparent material layer 400, that is, the second transparent material layer 420 in a case of FIG. 1 may cover all or some of the pads 130. Accordingly, since a portion of the bonding wire 500 which is connected to the pads 130 is surrounded by the second transparent material layer 420, it is possible to prevent short-circuit between the bonding wire 500 and the pads 130 in the process of forming the opaque resin layer 700.

Figure 4:
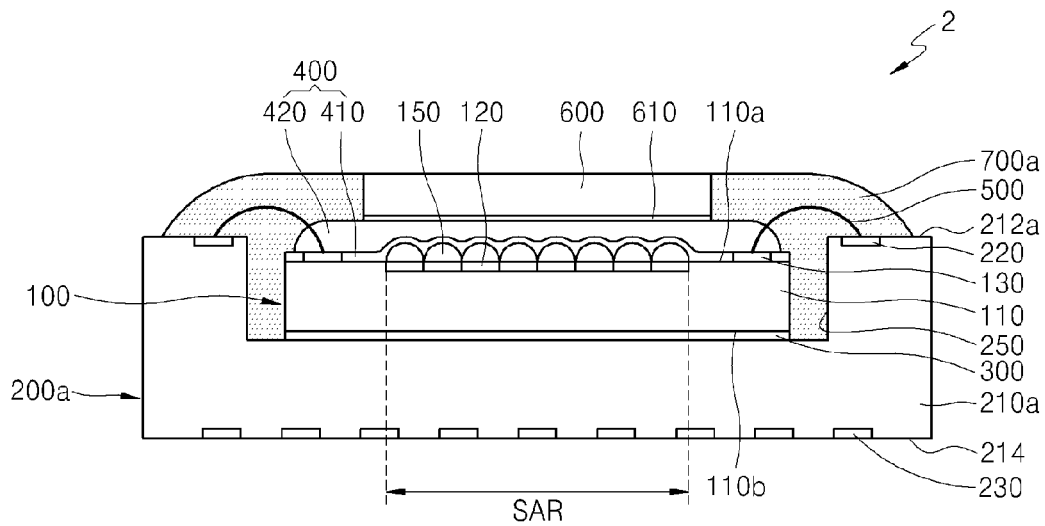

FIG. 4 is a cross-sectional view showing an aspect of an image sensor package 2 according to an embodiment of the inventive concept.

Referring to FIG. 4, the image sensor package 2 includes a package base substrate 200a, an image sensor chip 100, and a transparent protection cover 600. The image sensor package 2 may be formed by attaching a substrate 110 constituting the image sensor chip 100 onto a package base substrate 200a and then attaching the transparent protection cover 600 onto the image sensor chip 100.

Unlike the flat upper surface 212 of the package base substrate 200 of the image sensor package 1 shown in FIG. 3, the package base substrate 200a of the image sensor package 2 shown in FIG. 4 has an upper surface 212a defining a recess 250, and a substrate 110 constituting the image sensor chip 100 is attached to the inside of the recess 250.

Here, the flat upper surface 212 of the package base substrate 200 shown in FIG. 3 does not disclose that the upper surface 212 of the package base substrate 200 is completely flat, but discloses that the base portion 210 constituting the package base substrate 200 has the upper surface 212 of which the level is uniform as a whole. Accordingly, the upper surface 212 of the package base substrate 200 may have a relatively small difference in level by the upper pads 220 and wiring patterns formed in the upper surface 212, and such a relatively small difference in level may be offset by a die adhesive film 300.

In the package base substrate 200a shown in FIG. 4, the recess 250 is defined by an upper surface 212a of a base portion 210a being dent. The recess 250 is not offset by the die adhesive film 300, and the entirety or a portion of the image sensor chip 100 may be accommodated in a space defined by the recess 250.

The first surface 110a of the substrate 110 constituting the image sensor chip 100 attached to the inside of the recess 250 may have a level which is lower than that of an uppermost surface of the package base substrate 200a. That is the first surface 110a may have a level which is lower than that of a portion other than the recess 250 of the upper surface 212a of the package base substrate 200a. In an embodiment, the entire substrate 110 constituting the image sensor chip 100 may be accommodated in the space defined by the recess 250.

FIG. 4 shows that a portion of the transparent material layer 400 protrudes from above the recess 250. In an embodiment, the entirety of the transparent material layer 400 may be accommodated in the recess 250.

The image sensor package 2 may further include an opaque resin layer 700a on the package base substrate 200a. The opaque resin layer 700a may surround the bonding wire 500 and may cover lateral sides of the substrate 110 and the transparent protection cover 600. The opaque resin layer 700a may fill the recess 250. That is, the opaque resin layer 700a may fill the space other than the portions occupied by the image sensor chip 100 and the transparent material layer 400, in the inner space of the recess 250. The opaque resin layer 700a may cover the entire bottom of the recess 250 which is exposed by the side wall of the recess 250 and the substrate 110 constituting the image sensor chip 100.

Figure 5:
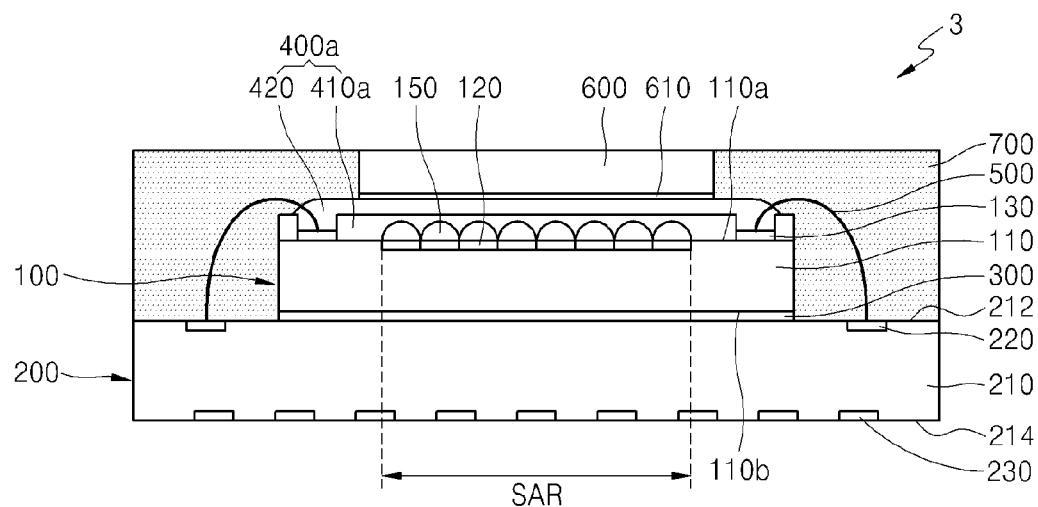

FIG. 5 is a cross-sectional view showing an aspect of an image sensor package 3 according to an embodiment of the inventive concept.

Referring to FIG. 5, the image sensor package 3 includes a package base substrate 200, an image sensor chip 100, and a transparent protection cover 600. The image sensor package 3 may be formed by attaching a substrate 110 constituting the image sensor chip 100 onto the package base substrate 200 and then attaching the transparent protection cover 600 onto the image sensor chip 100.

The transparent protection cover 600 is attached onto a plurality of microlenses 150 with a transparent material layer 400a interposed therebetween. The transparent material layer 400a may include at least two transparent material layers, for example, a first transparent material layer 410a and a second transparent material layer 420. The transparent material layer 400a may fill a space between a sensor array region SAR of the substrate 110 and the transparent protection cover 600.

According to an embodiment, the first transparent material layer 410a shown in FIG. 5 may fill all spaces between the plurality of microlenses 150. The first transparent material layer 410a may be formed to be a relatively thicker than the first transparent material layers 410 shown in FIGS. 3 and 4. The first transparent material layer 410a may have a refractive index which is equal or similar to that of the microlens 150 and may reduce differences in level of upper surfaces of the plurality of microlenses 150. Accordingly, it is possible to prevent diffused reflection of incident light from occurring due to the differences in level of the upper surfaces of the plurality of microlenses 150.

Figure 6:
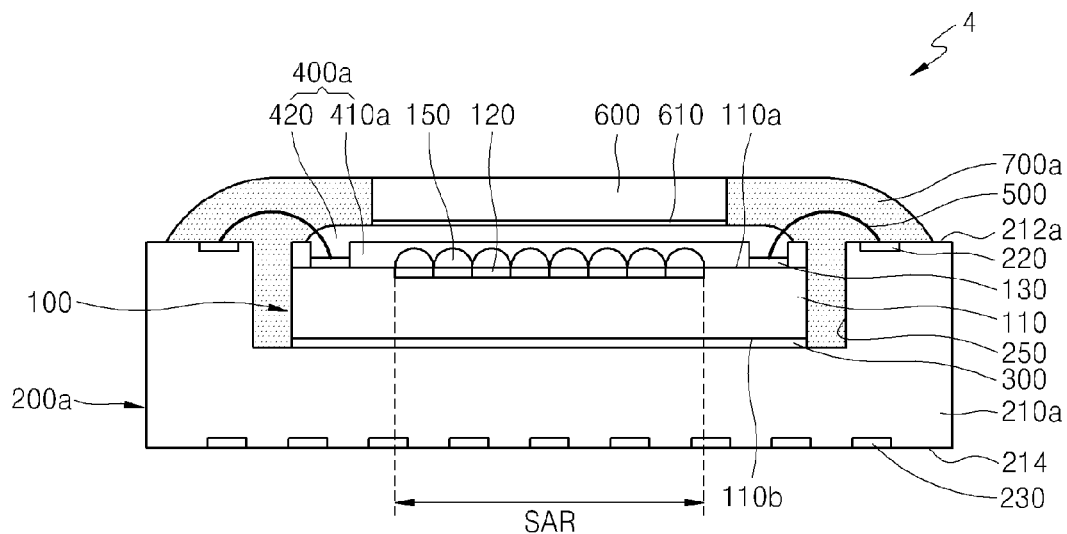

FIG. 6 is a cross-sectional view showing an aspect of an image sensor package 4 according to an embodiment of the inventive concept. In the description regarding FIG. 6, the same description as FIGS. 3 to 5 may be omitted.

Referring to FIG. 6, the image sensor package 4 includes a package base substrate 200a, an image sensor chip 100, and a transparent protection cover 600. The image sensor package 4 may be formed by attaching a substrate 110 constituting the image sensor chip 100 onto the package base substrate 200a and then attaching the transparent protection cover 600 onto the image sensor chip 100.

According to an embodiment, the package base substrate 200a of the image sensor package 4 shown in FIG. 6 has an upper surface 212a defining a recess 250 similar to the package base substrate 200a of the image sensor package 2 shown in FIG. 4, and the substrate 110 constituting the image sensor chip 100 is attached to the inside of the recess 250.

According to an embodiment, the first transparent material layer 410a shown in FIG. 6 may have a flat upper surface, similar to the first transparent material layer 410a shown in FIG. 5.

Figure 7:
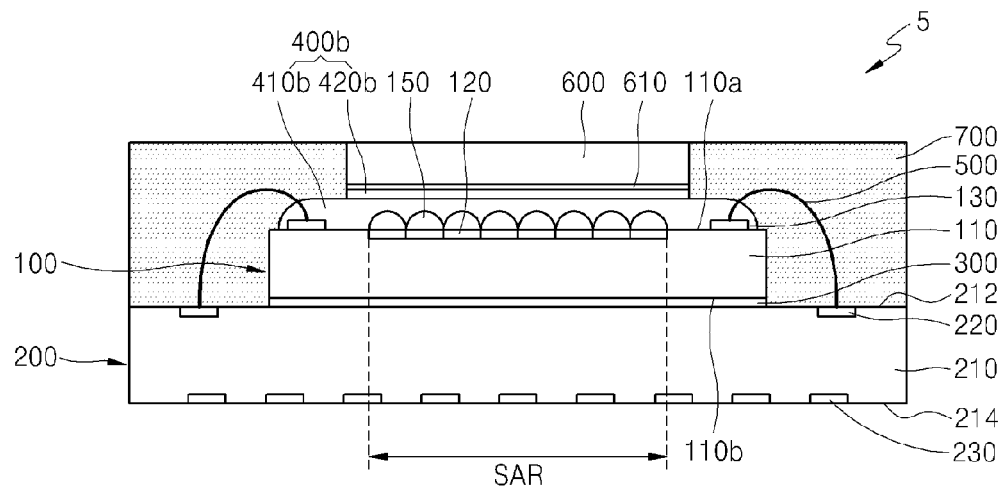

FIG. 7 is a cross-sectional view showing an aspect of an image sensor package 5 according to an embodiment of the inventive concept.

Referring to FIG. 7, the image sensor package 5 includes a package base substrate 200, an image sensor chip 100, and a transparent protection cover 600. The image sensor package 5 may be formed by attaching a substrate 110 constituting the image sensor chip 100 onto the package base substrate 200 and then attaching the transparent protection cover 600 onto the image sensor chip 100.

The transparent protection cover 600 is attached onto a plurality of microlenses 150 with a transparent material layer 400b interposed therebetween. The transparent material layer 400b may include at least two transparent material layers, for example, a first transparent material layer 410b and a second transparent material layer 420b. The transparent material layer 400b may fill the entire space between a sensor array region SAR of the substrate 110 and the transparent protection cover 600.

According to an embodiment, the first transparent material layer 410b shown in FIG. 6 may cover all or some of a plurality of pads 130. The first transparent material layer 410b may overlap all or some of the pads 130 in a direction perpendicular to a first surface 110a of the substrate 110 to cover all or some of the pads 130. The second transparent material layer 420b may not overlap some or all of the pads 130 in a direction perpendicular to the first surface 110a of the substrate 110.

The first transparent material layer 410b may be formed on the image sensor chip 100 by using a dispensing method. The first transparent material layer 410b may have a round upper surface by surface tension after being dispensed onto the image sensor chip 100. Thereafter, the first transparent material layer 410b may have a flat upper surface which contacts a lower surface of the transparent protection cover 600 by the attachment of the transparent protection cover 600 onto the first transparent material layer 410b.

For example, the second transparent material layer 420b is manufactured in the form of a film. The second transparent material layer 420b may be attached first onto the lower surface of the transparent protection cover 600, and then the second transparent material layer 420b and the transparent protection cover 600 may be attached together onto the first transparent material layer 410b dispensed onto the image sensor chip 100.

Therefore, the transparent protection cover 600 and the second transparent material layer 420b may have the same area. That is, the second transparent material layer 420b and the transparent protection cover 600 may overlap each other in a direction perpendicular to the first surface 110a of the substrate 110. The second transparent material layer 420b may expose at least some of the pads 130 in a direction perpendicular to the first surface 110a of the substrate 110.

Figure 8:
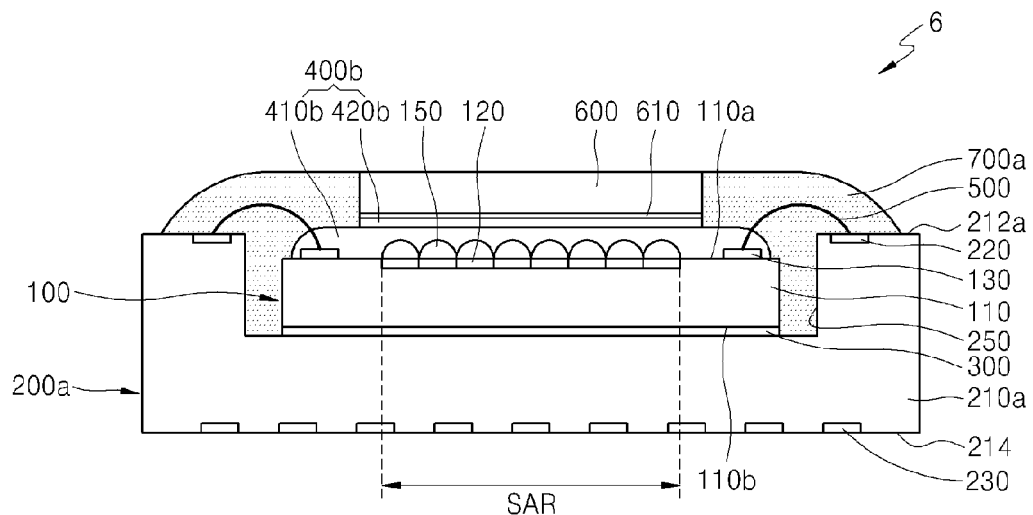

FIG. 8 is a cross-sectional view showing an aspect of an image sensor package 6 according to an embodiment of the inventive concept.

Referring to FIG. 8, the image sensor package 6 includes a package base substrate 200a, an image sensor chip 100, and a transparent protection cover 600. The image sensor package 6 may be formed by attaching a substrate 110 constituting the image sensor chip 100 onto the package base substrate 200a and then attaching the transparent protection cover 600 onto the image sensor chip 100.

According to an embodiment, the package base substrate 200a of the image sensor package 6 shown in FIG. 8 has an upper surface 212a defining a recess 250 similar to the package base substrate 200a of the image sensor packages 2 and 4 shown in FIGS. 4 and 6, and the substrate 110 constituting the image sensor chip 100 is attached to the inside of the recess 250.

Like the first transparent material layer 410b shown in FIG. 7, the first transparent material layer 410b shown in FIG. 8 may cover all or some of a plurality of pads 130.

For example, the second transparent material layer 420b is manufactured in the form of a film. The second transparent material layer 420b may be attached first onto a lower surface of the transparent protection cover 600, and then the second transparent material layer 420b and the transparent protection cover 600 may be attached together onto the first transparent material layer 410b. Therefore, the transparent protection cover 600 and the second transparent material layer 420b may have the same area. The second transparent material layer 420b may expose at least some of the pads 130 in a direction perpendicular to a first surface 110a of the substrate 110.

Figure 9:
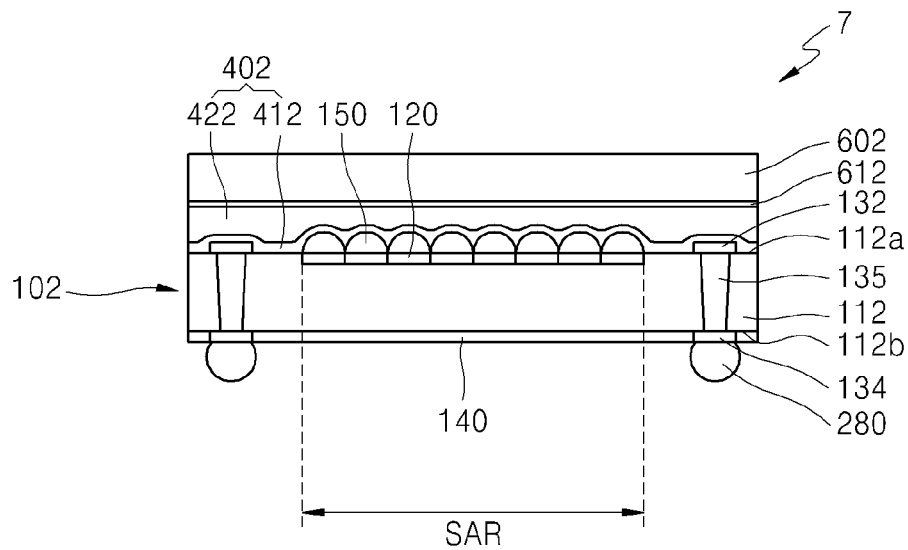

FIG. 9 is a cross-sectional view showing an aspect of an image sensor package 7 according to an embodiment of the inventive concept.

Referring to FIG. 9, the image sensor package 7 includes an image sensor chip 102 and a transparent protection cover 602. The image sensor package 7 may be formed by attaching a transparent protection cover 602 onto the image sensor chip 102.

The image sensor chip 102 includes pads 132 and 134 including first pads 132 and second pads 134 which are respectively formed in an upper surface 112a and a lower surface 112b of a substrate 112, and a through electrode 135 that electrically connects the first pads 132 and the second pads 134 and is exposed by a second surface 112b through the substrate 112. The through electrode 135 may be formed as a through silicon via (TSV). The through electrode 135 may include a wiring metal layer and a barrier metal layer surrounding the wiring metal layer. The wiring metal layer may include Cu or W. For example, the wiring metal layer may be formed of Cu, CuSn, CuMg, CuNi, CuZn, CuPd, CuAu, CuRe, CuW, W, or a W alloy, but the inventive concept is not limited thereto. For example, the wiring metal layer may include one or more of Al, Au, Be, Bi, Co, Cu, Hf, In, Mn, Mo, Ni, Pb, Pd, Pt, Rh, Re, Ru, Ta, Te, Ti, W, Zn, and Zr, or may include a stacked structure including one or two or more thereof. The barrier metal layer may include at least one material selected from W, WN, WC, Ti, TiN, Ta, TaN, Ru, Co, Mn, WN, Ni, and NiB, or may be formed to have a single-layered structure or a multi-layered structure. However, the material of the through electrode 135 is not limited to the above-described materials. The barrier metal layer and the wiring metal layer may be formed by a physical vapor deposition (PVD) process or a chemical vapor deposition (CVD) process, but the inventive concept is not limited thereto. A spacer insulating layer may be interposed between the through electrode 135 and the substrate 102. The spacer insulating layer may prevent electronic devices within the substrate 102 from contacting the through electrode 135. The spacer insulating layer may be formed of an oxide film, a nitride film, a carbide film, a polymer, or a combination thereof. In some embodiments, a CVD process may be used to form the spacer insulating layer. The spacer insulating layer may be formed of an ozone/tetra-ethyl ortho-silicate ($O_3$/TEOS)-based high aspect ratio process (HARP) oxide film which is formed by a sub-atmospheric CVD process.

The through electrode 135 is described to directly connect the first pads 132 to the second pads 134. However, the inventive concept is not limited thereto, and the through electrode 135 may be formed to have any one structure of via-first, via-middle, and via-last structures. The via-first, via-middle, and via-last structures and a manufacturing method are described in numerous documents as well as books such as Three Dimensional System Integration published in 2011 by Springer, 3D Integration for VLSI Systems published in 2012 by CRC Press, and Designing TSVs for 3D Integrated Circuits published in 2012 by Springer, and thus the detailed description thereof will be omitted here.

The transparent protection cover 602 is attached onto the substrate 112 constituting the image sensor chip 102 with the transparent material layer 402 interposed therebetween. The transparent material layer 402 may include at least two transparent material layers, for example, a first transparent material layer 412 and a second transparent material layer 422. The transparent material layer 402 may fill the entire space between the substrate 112 and the transparent protection cover 602. The first transparent material layer 412 and the second transparent material layer 422 may overlap all the first pads 132 in a direction perpendicular to the first surface 112a of the substrate 112 to cover all the first pads 132.

For example, the first transparent material layer 412 may be formed by being coated with a transparent material by using a spin coating method so as to cover the first surface 112a of the substrate 112. The first transparent material layer 412 may have a difference in level in the upper surface thereof. That is, the first transparent material layer 412 may be formed on the first pads 132 and a plurality of microlenses 150 in a conformal manner, and thus may have a difference in level which is formed by transfer of the differences in level of the upper surfaces of the first pads 132 and the plurality of microlenses 150. In an embodiment, the first transparent material layer 412 has a difference in level in the upper surface thereof, but may have a difference in level which is relatively lower than the differences in level of the upper surfaces of the plurality of microlenses 150. That is, the first transparent material layer 412 fills some of spaces between lateral sides of the first pads 132 or the plurality of microlenses 150 to thereby reduce the difference in level due to the first pads 132 and/or the plurality of microlenses 150.

The first transparent material layer 410 shown in FIG. 3 exposes all or some of the pads 130 formed in the upper surface 110a of the substrate 110, but the first transparent material layer 412 shown in FIG. 9 may cover all the first pads 132 formed in the upper surface 112a of the substrate 112.

The second transparent material layer 422 may be formed on the image sensor chip 102 on which the first transparent material layer 412 is formed, by using a dispensing method. The second transparent material layer 422 may have a round upper surface by surface tension after being dispensed onto the first transparent material layer 412. Thereafter, the second transparent material layer 422 may have a flat upper surface which contacts a lower surface of the transparent protection cover 602 by the attachment of the transparent protection cover 602 onto the second transparent material layer 422.

The transparent protection cover 602, the first transparent material layer 412, the second transparent material layer 422, and the substrate 112 may have the same area. The substrate 112 and the transparent protection cover 602 may overlap each other in a direction perpendicular to the first surface 112a of the substrate 112, and the transparent material layer 402 may fill the entire space between the first surface 112a of the substrate 112 and the transparent protection cover 602. The lateral sides of the substrate 112, the transparent material layer 402, and the transparent protection cover 602 may be connected to each other in a direction perpendicular to the first surface 112a of the substrate 112.

A rear protection layer 140 may be formed on the second surface 112b of the substrate 112 to expose the second pads 134. The rear protection layer 140 may be formed of an oxide film or a nitride film, or may be formed to have a bi-layered structure of an oxide film and a nitride film. In an embodiment, the rear protection layer 140 may be formed of an oxide film, for example, a silicon oxide film ($SiO_2$) by using a high density plasma chemical vapor deposition (HDP-CVD) process.

A connection terminal 280 capable of electrically connecting an external device to the image sensor package 7 may be attached onto the second pads 134. The connection terminal 280 may be a bump or a solder ball. The connection terminal 280 may be formed of solder containing tin (Sn), palladium (Pd), nickel, silver (Ag), lead (Pb), or an alloy thereof.

The image sensor package 7 shown in FIG. 9 may be a wafer level package (WLP), such as the image sensor packages 1, 2, 3, 4, 5, and 6 shown in FIGS. 3 to 8, which does not include the package base substrates 200 and 200a.

Figure 10:
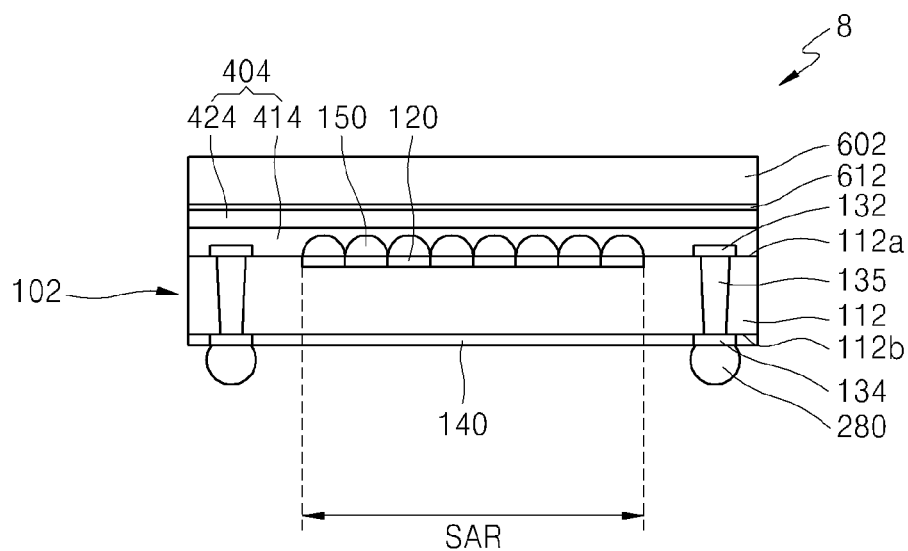

FIG. 10 is a cross-sectional view showing an aspect of an image sensor package 8 according to an embodiment of the inventive concept.

Referring to FIG. 10, the image sensor package 8 includes an image sensor chip 102 and a transparent protection cover 602. The image sensor package 8 may be formed by attaching the transparent protection cover 602 onto the image sensor chip 102.

The transparent protection cover 602 is attached onto the substrate 112 constituting the image sensor chip 102 with a transparent material layer 404 interposed therebetween. The transparent material layer 404 may include at least two transparent material layers, for example, a first transparent material layer 414 and a second transparent material layer 424. The transparent material layer 404 may fill the entire space between the substrate 112 and the transparent protection cover 602.

According to an embodiment, the first transparent material layer 414 shown in FIG. 10 may have a flat upper surface. The first transparent material layer 414 may fill all spaces between a plurality of microlenses 150. The first transparent material layer 414 may be formed to be a relatively thicker than the first transparent material layer 412 shown in FIG. 9. The first transparent material layer 414 may be formed by using a spin coating method or a dispensing method.

For example, the second transparent material layer 424 is manufactured in the form of a film. The second transparent material layer 424 may be attached first onto a lower surface of the transparent protection cover 602, and then the second transparent material layer 424 and the transparent protection cover 602 may be attached together onto the first transparent material layer 414 formed on the image sensor chip 102.

FIGS. 11 to 15 are cross-sectional views sequentially showing an aspect of a method of manufacturing an image sensor package according to an embodiment of the inventive concept. FIGS. 11 to 15 are cross-sectional view sequentially showing a method of manufacturing the image sensor package 1 shown in FIG. 3.

Figure 11:
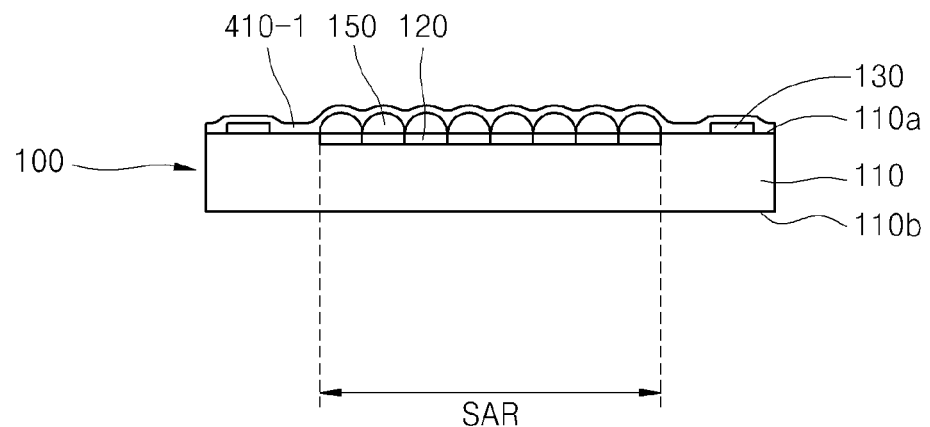
FIGS. 11 to 15 are cross-sectional views showing a method of manufacturing an image sensor package according to an embodiment of the inventive concept.

Referring to FIG. 11, a first transparent material 410-1 is formed on the image sensor chip 100. For example, the first transparent material 410-1 may be formed by using a spin coating method. The first transparent material 410-1 may have a difference in level in the upper surface thereof. The first transparent material 410-1 may cover the entire first surface 110a of the substrate 110, and may cover the microlenses 150 and the pads 130 which are formed on the first surface 110a of the substrate 110.

The first transparent material 410-1 is formed by using a spin coating method, and then may have a B-stage state or a C-stage state through heat treatment.

Figure 12:
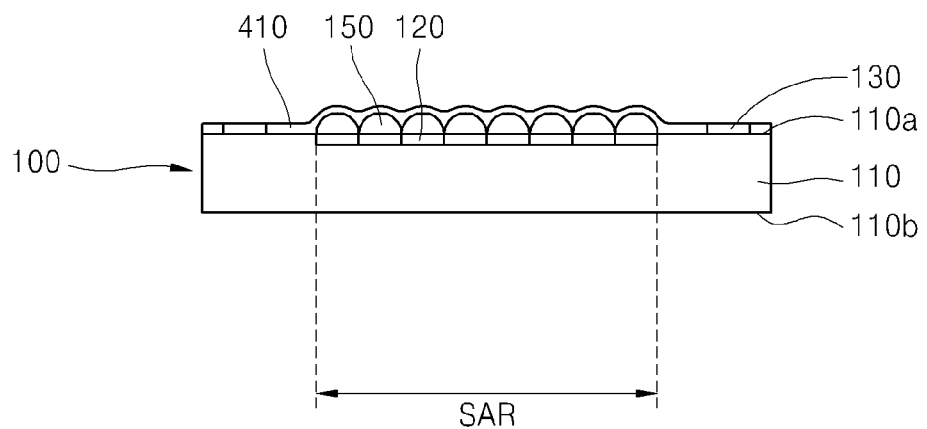

Referring to FIG. 12, a portion of the first transparent material 410-1 shown in FIG. 11 is removed to form the first transparent material layer 410 that exposes at least some of the pads 130.

In FIG. 12, the first transparent material layer 410 is shown to expose all the upper surfaces of the pads 130 and to cover all the lateral sides of the pads 130, but the inventive concept is not limited thereto. The first transparent material layer 410 may cover some of the upper surfaces of the pads 130, in particular, portions contacting edges of the upper surfaces of the pads 130, or may expose all or some of the lateral sides of the pads 130.

Although FIG. 12 shows only one image sensor chip 100, the first transparent material layer 410 may be formed on a wafer including the plurality of image sensor chips 100. In an embodiment, after the first transparent material layer 410 is formed, a singulation process of separating the plurality of image sensor chips 100 from each other may be performed.

Figure 13:
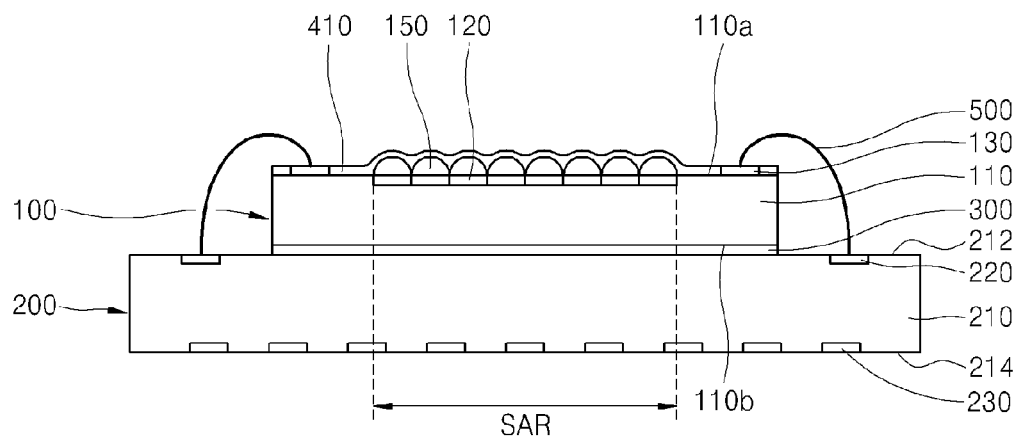

Referring to FIG. 13, the image sensor chip 100 is attached onto the upper surface 212 of the package base substrate 200. The image sensor chip 100 may be attached onto the package base substrate 200 by the die adhesive film 300. Thereafter, the bonding wire 500 connecting the upper pads 220 of the package base substrate 200 to the pads 130 of the image sensor chip 100 is formed.

Figure 14:
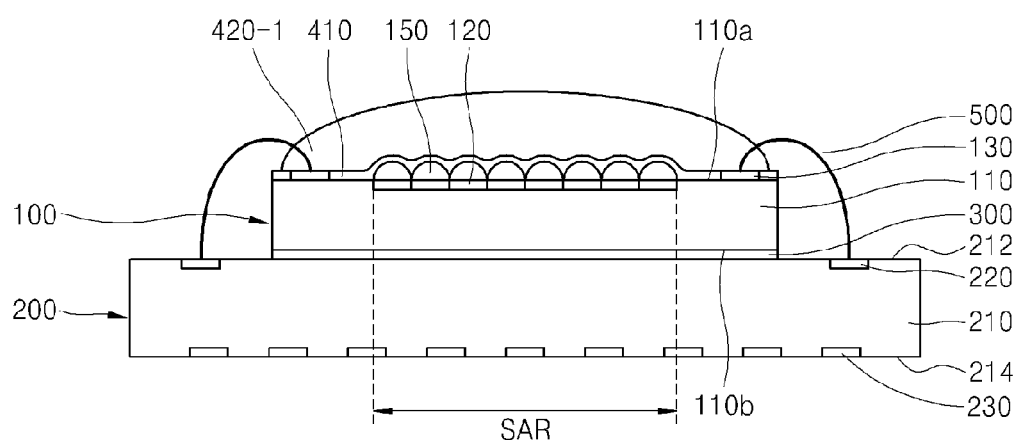

Referring to FIG. 14, a second transparent material 420-1 is formed on the image sensor chip 100. The second transparent material 420-1 may be formed on the image sensor chip 100 on which the first transparent material layer 410 is formed, by using a dispensing method. The second transparent material 420-1 may have a round upper surface by surface tension.

After the second transparent material 420-1 is formed by using a dispensing method, the second transparent material 420-1 may be set to be in an A-stage state or may be set to be in a B-stage state through heat treatment.

Figure 15:
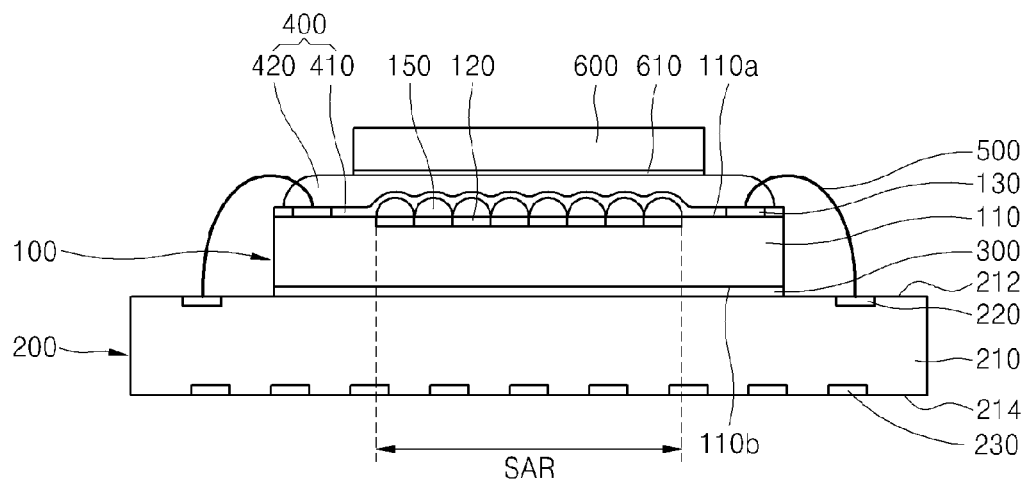

Referring to FIG. 15, the second transparent material 420-1 shown in FIG. 14 is formed, and then the transparent protection cover 600 is attached onto the image sensor chip 100. Since the second transparent material 420-1 is in the A-stage or the B-stage state, the transparent protection cover 600 is attached onto the second transparent material 420-1, and thus the second transparent material layer 420 having a flat upper surface contacting the lower surface of the transparent protection cover 600 is formed.

The infrared shielding film 610 may be selectively formed on the lower surface of the transparent protection cover 600. The infrared shielding film 610 is formed in the transparent protection cover 600 before the transparent protection cover 600 is formed on the image sensor chip 100, and then the transparent protection cover 600 may be attached onto the image sensor chip 100. The transparent protection cover 600 having the infrared shielding film 610 formed on the lower surface thereof is attached onto the second transparent material 420-1, and thus the second transparent material layer 420 having a flat upper surface which contacts the infrared shielding film 610 on the lower surface of the transparent protection cover 600 is formed.

The transparent protection cover 600 overlaps the sensor array region SAR in a direction perpendicular to the first surface 110a of the substrate 110, and may be attached onto the image sensor chip 100 so as to expose the pads 130.

Thereafter, as shown in FIG. 3, the image sensor package 1 is formed by forming the opaque resin layer 700 that surrounds the bonding wire 500 and covers the lateral sides of the substrate 110 and the transparent protection cover 600. The opaque resin layer 700 may be formed using a mold or may be formed by dispensing a resin material onto the lateral sides of the transparent protection cover 600 and the substrate 110.

Heat treatment for hardening the transparent material layer 400 including the first transparent material layer 410 and the second transparent material layer 420 to be in a C-stage may be performed before forming the opaque resin layer 700 or simultaneously with the formation of the opaque resin layer 700.

According to an embodiment, the image sensor package 3 shown in FIG. 5 may be formed to be thicker so that the first transparent material 410-1 shown in FIG. 11 has a flat upper surface.

Figure 16:
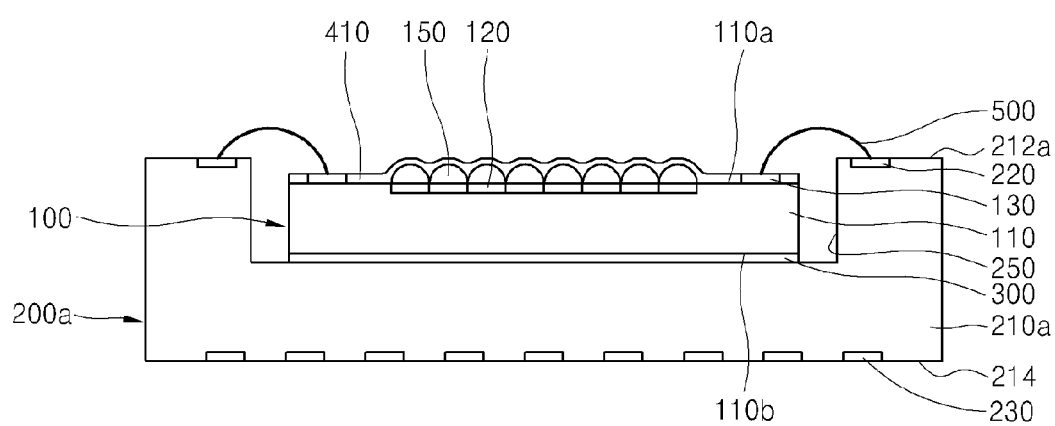
FIGS. 16 and 17 are cross-sectional views showing a method of manufacturing an image sensor package according to an embodiment of the inventive concept.
Figure 17:
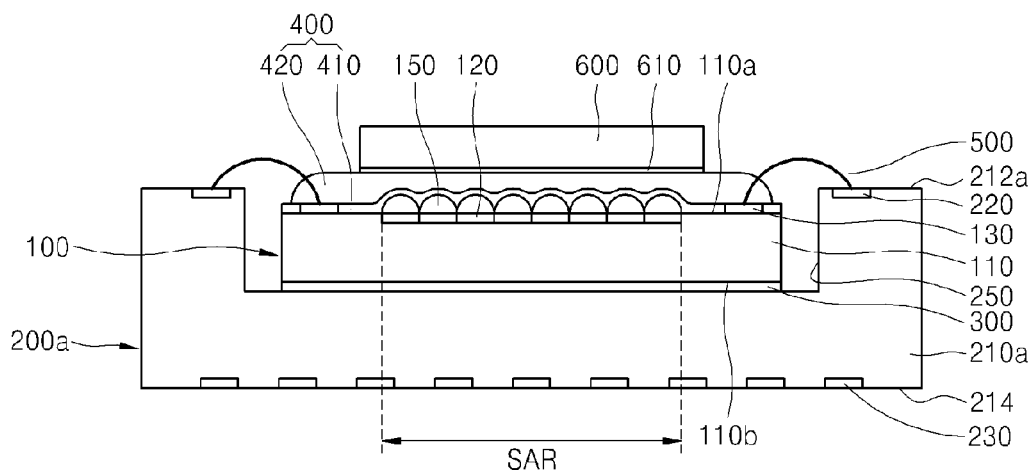

FIGS. 16 and 17 are cross-sectional views showing an aspect of a method of manufacturing an image sensor package according to an embodiment of the inventive concept. FIGS. 16 and 17 are cross-sectional views sequentially showing a method of manufacturing the image sensor package 2 shown in FIG. 4, and FIG. 16 shows a process after FIG. 12.

Referring to FIG. 16, the image sensor chip 100 is attached to the inside of the recess 250 which is defined by the upper surface 212a of the package base substrate 200a. The image sensor chip 100 may be attached to the inside of the recess 250 which is defined by the die adhesive film 300 and the upper surface 212a of the package base substrate 200a. Thereafter, the bonding wire 500 connecting the upper pads 220 of the package base substrate 200a to the pads 130 of the image sensor chip 100 is formed.

The first surface 110a of the substrate 110 constituting the image sensor chip 100 attached to the inside of the recess 250 may have a level which is lower than that of an uppermost surface of the package base substrate 200a, that is, that of a portion other than the recess 250 of the upper surface 212a of the package base substrate 200a. That is, the entire substrate 110 constituting the image sensor chip 100 may be accommodated in the recess 250.

Referring to FIG. 17, the second transparent material layer 420 and the transparent protection cover 600 are attached onto the image sensor chip 100. A method of attaching the second transparent material layer 420 and the transparent protection cover 600 onto the image sensor chip 100 is described in FIGS. 14 and 15, and thus the detailed description thereof will be omitted here.

Thereafter, as shown in FIG. 4, the image sensor package 2 is formed by forming the opaque resin layer 700a that covers the bonding wire 500 and covers the lateral sides of the substrate 110 and the transparent protection cover 600. The opaque resin layer 700a may be formed by dispensing a resin material onto the lateral sides of the substrate 110 and the transparent protection cover 600. The opaque resin layer 700a may be dispensed onto the package base substrate 200a so as to fill the space other than the space where the image sensor chip 100 and the transparent material layer 400 are accommodated, in the space defined by the recess 250.

According to an embodiment, the image sensor package 4 shown in FIG. 6 may be formed to be thicker so that the first transparent material layer 410 shown in FIG. 16 has a flat upper surface.

Figure 18:
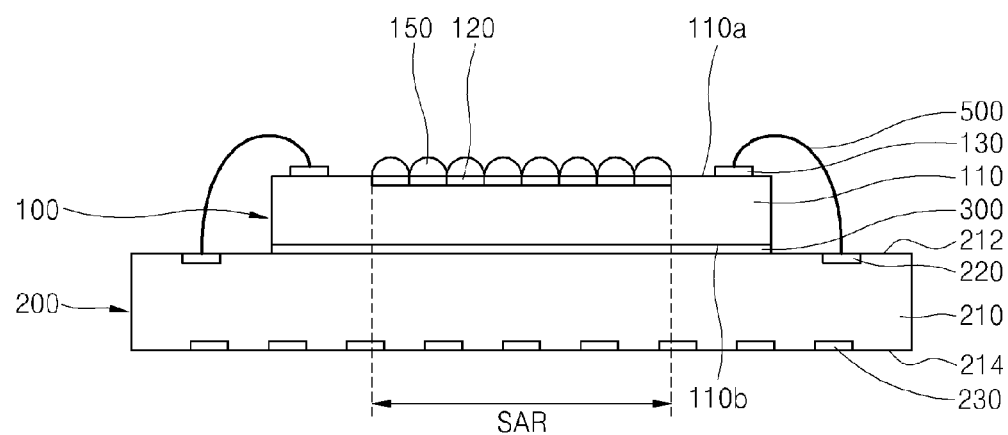
FIGS. 18 to 20 are cross-sectional views showing a method of manufacturing an image sensor package according to an embodiment of the inventive concept.
Figure 19:
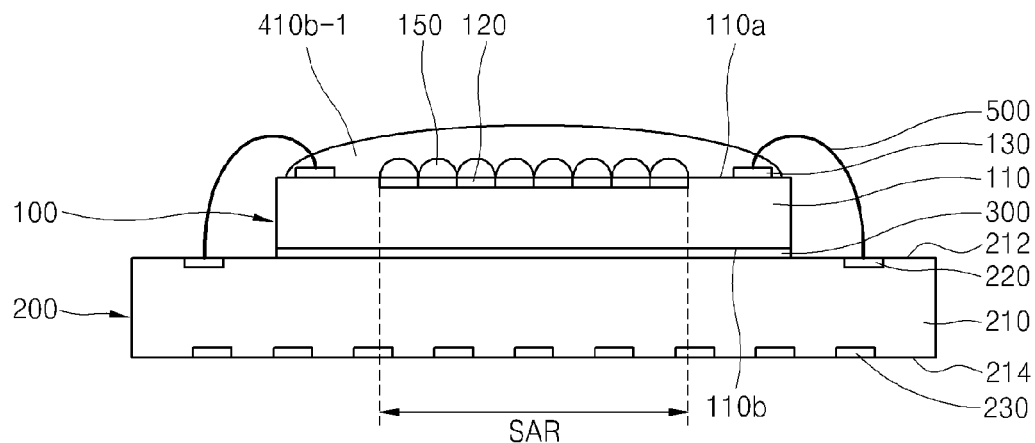
Figure 20:
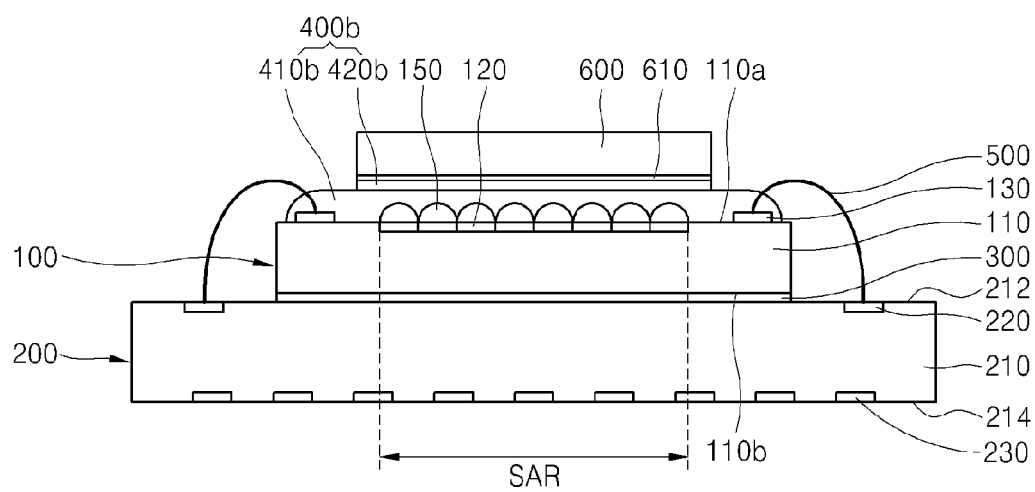

FIGS. 18 to 20 are cross-sectional views showing an aspect of a method of manufacturing an image sensor package according to an embodiment of the inventive concept. FIGS. 18 to 20 are cross-sectional views showing an aspect of a method of manufacturing the image sensor package 5 shown in FIG. 7.

Referring to FIG. 18, the image sensor chip 100 is attached onto the upper surface 212 of the package base substrate 200. The image sensor chip 100 may be attached onto the package base substrate 200 by the die adhesive film 300. Thereafter, the bonding wire 500 connecting the upper pads 220 of the package base substrate 200 to the pads 130 of the image sensor chip 100 is formed.

In FIG. 13, the image sensor chip 100 is attached onto the package base substrate 200 after the first transparent material layer 410 is formed on the image sensor chip 100. On the other hand, in FIG. 18, the image sensor chip 100 is attached onto the package base substrate 200 before the first transparent material layer 410b (see FIG. 20) is formed.

Referring to FIG. 19, a first transparent material 410b-1 is formed on the image sensor chip 100. The first transparent material 410b-1 may be formed on the image sensor chip 100 by using a dispensing method. The first transparent material 410b-1 may cover all or some of the pads 130.

The first transparent material 410b-1 is formed by using a dispensing method, and then may be set to be in an A-stage state or may be set to be in a B-stage state through heat treatment.

Referring to FIG. 20, the first transparent material 410b-1 shown in FIG. 19 is formed, and then the second transparent material layer 420b and the transparent protection cover 600 are attached onto the image sensor chip 100. For example, the second transparent material layer 420b is manufactured in the form of a film. The second transparent material layer 420b may be attached first onto the lower surface of the transparent protection cover 600, and then the second transparent material layer 420b and the transparent protection cover 600 may be attached together onto the first transparent material 410*b*-1 dispensed onto the image sensor chip 100.

The infrared shielding film 610 may be selectively formed on the lower surface of the transparent protection cover 600. The infrared shielding film 610 is formed on the lower surface of the transparent protection cover 600 before the transparent protection cover 600 is formed on the image sensor chip 100. Thereafter, the film-shaped second transparent material layer 420*b* is attached onto the lower surface of the infrared shielding film 610, and then the transparent protection cover 600 having the infrared shielding film 610 and the second transparent material layer 420*b* formed therein may be attached onto the image sensor chip 100 onto which the first transparent material 410*b*-1 is dispensed.

Since the first transparent material 410*b*-1 shown in FIG. 19 is in an A-stage or B-stage state, the transparent protection cover 600 having the second transparent material layer 420*b* attached onto the lower surface thereof is attached onto the first transparent material 410*b*-1, and thus the first transparent material layer 410*b* having a flat upper surface contacting the lower surface of the second transparent material layer 420*b* is formed.

The transparent protection cover 600 overlaps the sensor array region SAR in a direction perpendicular to the first surface 110*a* of the substrate 110, and may be attached onto the image sensor chip 100 so as to expose the pads 130.

The second transparent material layer 420*b* may have the same area as the transparent protection cover 600, and thus may expose at least some of the pads 130 in a direction perpendicular to the first surface 110*a* of the substrate 110.

Thereafter, as shown in FIG. 7, the image sensor package 5 is formed by forming the opaque resin layer 700 that surrounds the bonding wire 500 and covers the lateral sides of the substrate 110 and the transparent protection cover 600.

Figure 21:
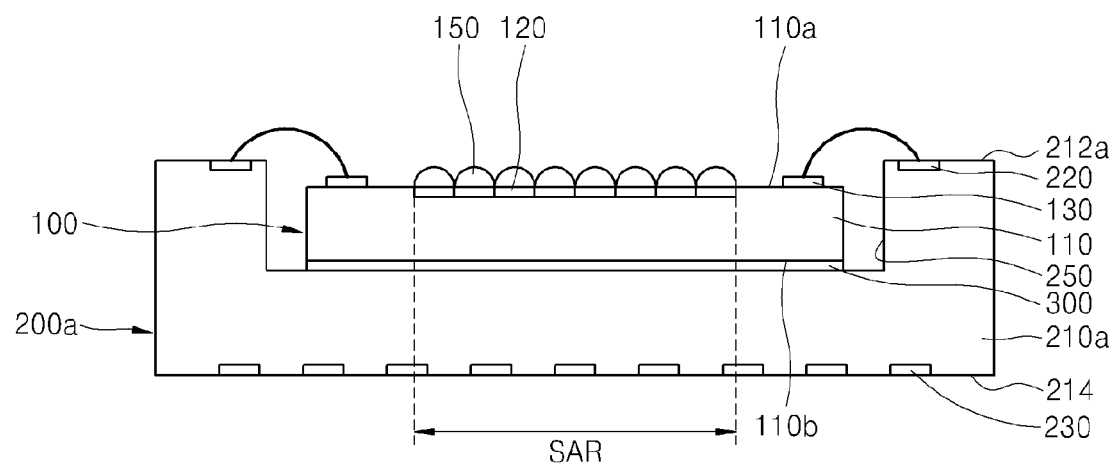
FIG. 21 is a cross-sectional view showing a method of manufacturing an image sensor package according to an embodiment of the inventive concept.

FIG. 21 is a cross-sectional view showing a method of manufacturing an image sensor package according to an embodiment of the inventive concept. FIG. 21 is a cross-sectional view showing a method of manufacturing the image sensor package 6 shown in FIG. 8.

Referring to FIG. 21, the image sensor chip 100 is attached to the inside of the recess 250 which is defined by the upper surface 212*a* of the package base substrate 200*a*. The image sensor chip 100 may be attached to the inside of the recess 250 which is defined by the die adhesive film 300 and the upper surface 212*a* of the package base substrate 200*a*. Thereafter, the bonding wire 500 connecting the upper pads 220 of the package base substrate 200*a* to the pads 130 of the image sensor chip 100 is formed.

In FIG. 16, the image sensor chip 100 is attached onto the package base substrate 200*a* after first transparent material layer 410 is formed on the image sensor chip 100. On the other hand, in FIG. 21, the image sensor chip 100 is attached onto the inside of the recess 250 which is defined by the upper surface 212*a* of the package base substrate 200*a* before the first transparent material layer 410*b* (see FIG. 8 or FIG. 20) is formed.

Thereafter, as shown in FIGS. 19 and 20, the transparent protection cover 600 having the second transparent material layer 420*b* attached onto the lower surface thereof is attached onto the image sensor chip 100, and then the image sensor package 6 is formed by forming the opaque resin layer 700*a* that surrounds the bonding wire 500 and covers the lateral sides of the substrate 110 and the transparent protection cover 600 as shown in FIG. 8.

FIGS. 22 to 25 are cross-sectional views showing a method of manufacturing an image sensor package according to an embodiment of the inventive concept. FIGS. 22 to 25 are cross-sectional views sequentially showing a method of manufacturing the image sensor package 7 shown in FIG. 9. Although FIGS. 22 to 25 shows only one image sensor chip 102, FIGS. 22 to 25 may show only one image sensor chip 102 in a wafer including the plurality of image sensor chips 102.

Figure 22:
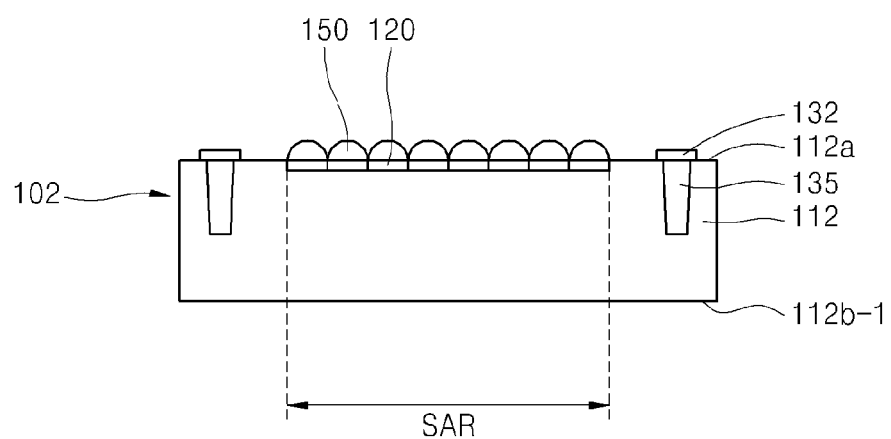
FIGS. 22 to 25 are cross-sectional views showing a method of manufacturing an image sensor package according to an embodiment of the inventive concept.

Referring to FIG. 22, the image sensor chip 102 is formed in which the through electrode 135 embedded in the substrate 112 from the upper surface 112*a* of the substrate 112. The through electrode 135 may not be exposed by a preliminary lower surface 112*b*-1 of the substrate 112.

Figure 23:
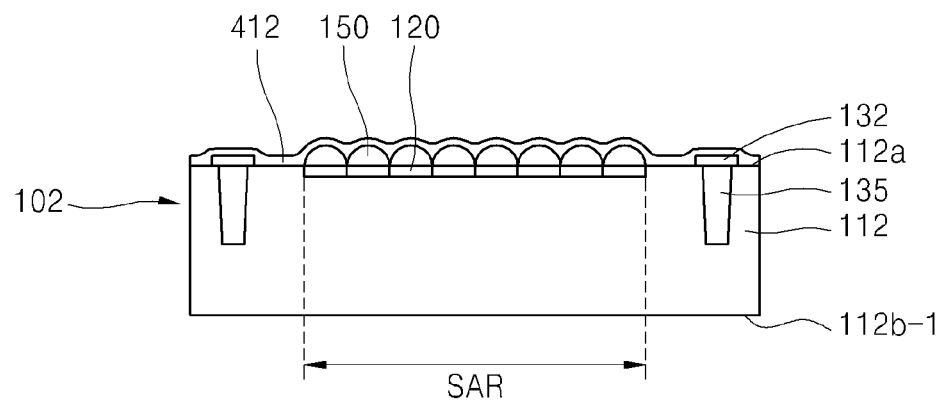

Referring to FIG. 23, the first transparent material layer 412 covering the upper surface 112*a* of the substrate 112 constituting the image sensor chip 102 is formed. For example, the transparent material layer 412 may be formed by coating the first surface 112*a* of the substrate 112 with a transparent material by using a spin coating method. The first transparent material layer 412 may have a difference in level in the upper surface thereof. That is, the first transparent material layer 412 may be formed on the first pads 132 and the plurality of microlenses 150 in a conformal manner, and thus may have a difference in level which is formed by transfer of the differences in level of the upper surfaces of the first pads 132 and the plurality of microlenses 150. According to an embodiment, the first transparent material layer 412 has a difference in level in the upper surface thereof, but may have a difference in level which is relatively lower than the differences in level of the upper surfaces of the first pads 132 and/or the plurality of microlenses 150. That is, the first transparent material layer 412 fills some of spaces between the lateral sides of the first pads 132 or spaces between the plurality of microlenses 150 to thereby reduce the difference in level due to the first pads 132 and/or the plurality of microlenses 150.

Figure 24:
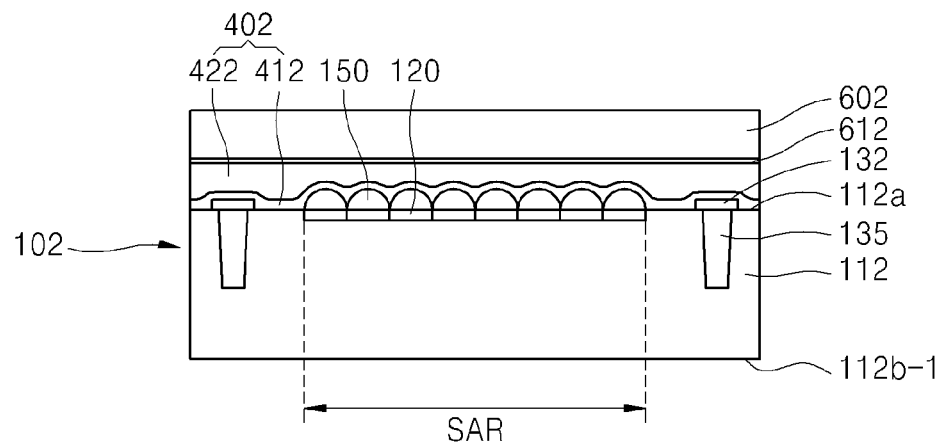

Referring to FIG. 24, the second transparent material layer 422 and the transparent protection cover 602 are formed on the image sensor chip 102 on which the first transparent material layer 412 is formed.

The second transparent material layer 422 may be formed on the image sensor chip 102 on which the first transparent material layer 412 is formed, by using a dispensing method. The second transparent material layer 422 may have a round upper surface by surface tension after being dispensed onto the first transparent material layer 412. Thereafter, the second transparent material layer 422 may have a flat upper surface which contacts a lower surface of the transparent protection cover 602 by the attachment of the transparent protection cover 602 onto the second transparent material layer 422.

The infrared shielding film 612 may be selectively formed on the lower surface of the transparent protection cover 602. The infrared shielding film 612 is formed in the transparent protection cover 602 before the transparent protection cover 602 is formed on the image sensor chip 102, and then the transparent protection cover 602 may be attached onto the image sensor chip 102. The transparent protection cover 602 having the infrared shielding film 612 formed on the lower surface thereof is attached onto the second transparent material 422, and thus the second transparent material layer 422 may have a flat upper surface which contacts the lower surface of the infrared shielding film 612.

Figure 25:
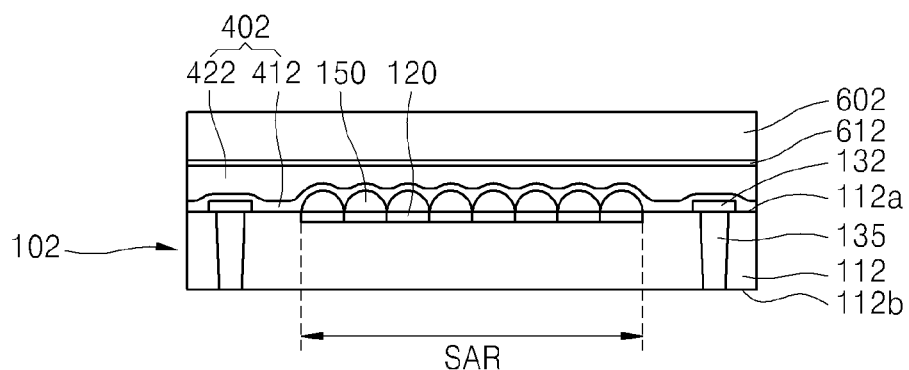

Referring to FIG. 25, the substrate 112 constituting the image sensor chip 102 shown in FIG. 24 is partially removed to thereby form the lower surface 112*b* that exposes the through electrode 135.

For example, a back lapping method and/or a chemical mechanical polishing (CMP) method may be used to partially remove the substrate 112.

Thereafter, as shown in FIG. 9, the second pads 134 electrically connected to the through electrode 135 is formed on the lower surface 112b of the substrate 112, and the rear protection layer 140 that covers the lower surface 112b of the substrate 112 and exposes the second pads 134 is formed. The connection terminal 280 may be attached onto the second pads 134 to form the image sensor package 7.

When the manufacturing method described using FIGS. 22 to 25 and FIG. 9 is performed by using the wafer including the plurality of image sensor chips 102, the image sensor package 7 may be formed through a singulation process of separating the plurality of image sensor chips 102 from each other.

According to an embodiment, the image sensor package 8 shown in FIG. 10 may be formed to be thicker so that the first transparent material layer 412 shown in FIG. 23 has a flat upper surface.

Figure 26:
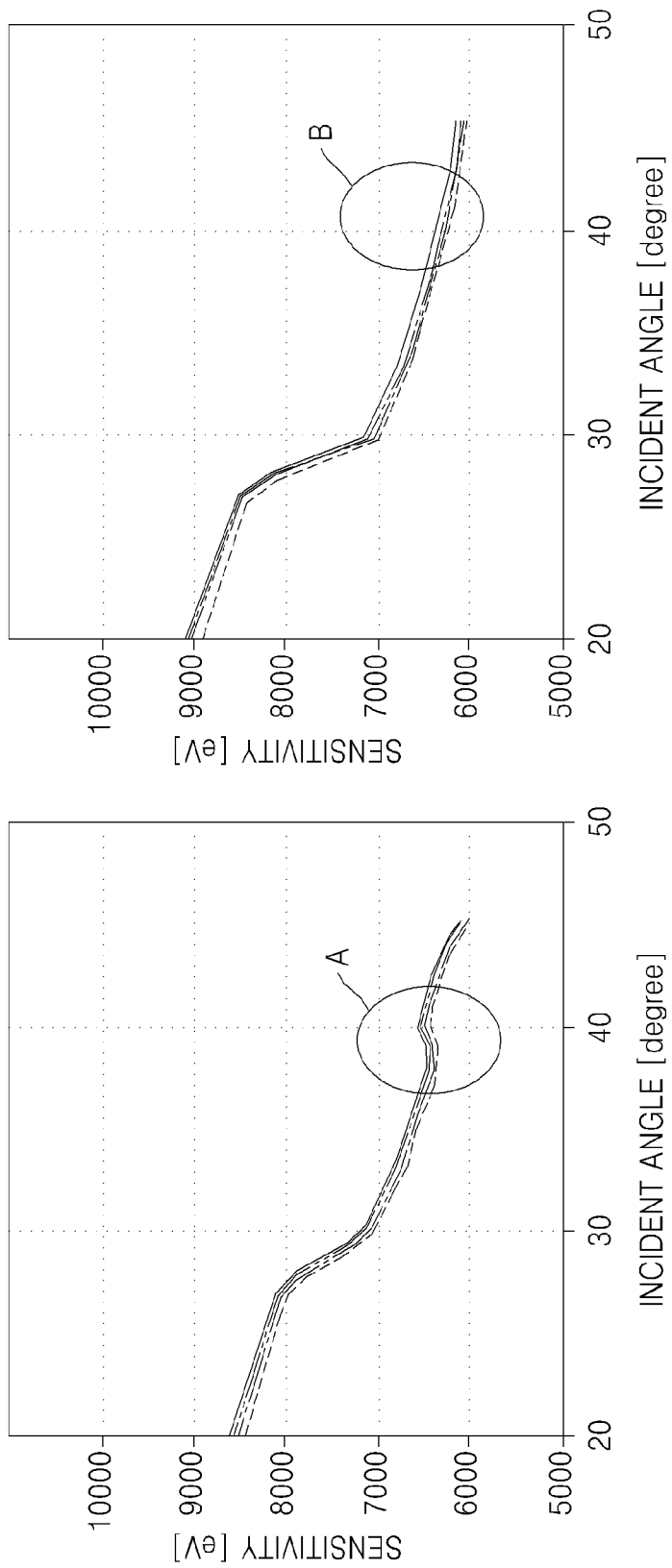
FIGS. 26A and 26B are graphs showing results of comparison of sensitivity depending on an incident angle of incident light between an image sensor package according to an embodiment of the inventive concept and an image sensor package according to a comparative example, respectively.

FIGS. 26A and 26B are graphs showing results of comparison of sensitivity depending on an incident angle of incident light between an image sensor package according to an embodiment of the inventive concept and an image sensor package filled with air. FIG. 26A is a graph showing sensitivity depending on an incident angle of incident light in an image sensor package filled with air (hereinafter, image sensor package according to a comparative example), and FIG. 26B is a graph showing sensitivity depending on an incident angle of incident light in an image sensor package according to an embodiment of the inventive concept.

Referring to FIGS. 26A and 26B, in the image sensor package according to a comparative example, when light having an incident angle of approximately 40 degrees is incident, a portion of which the sensitivity changes is generated (A). In the image sensor package according to an embodiment of the inventive concept, even light having a similar incident angle is incident, a portion of which the sensitivity changes is not generated (B).

A flare phenomenon may occur in the image sensor package according to a comparative example by the portion A of which the sensitivity changes, while a flare phenomenon does not occur in the image sensor package according to an embodiment of the inventive concept.

Figure 27:
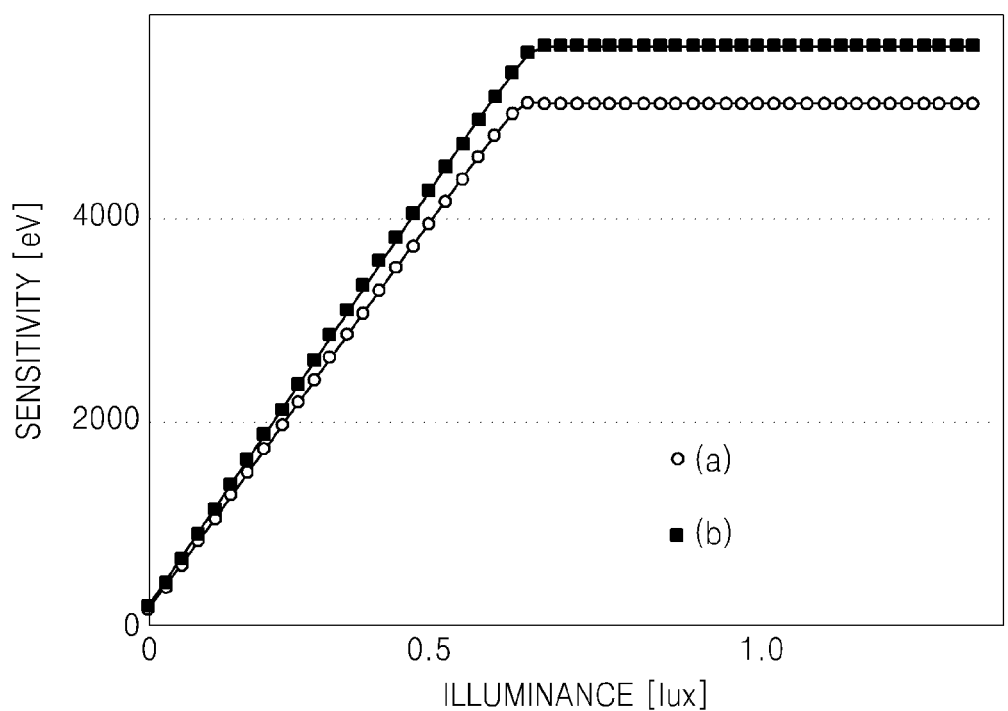
FIG. 27 is a graph showing a result of comparison of sensitivity depending on illuminance between an image sensor package according to an embodiment of the inventive concept and an image sensor package according to a comparative example.

FIG. 27 is a graph showing a result of comparison of sensitivity depending on illuminance between an image sensor package according to an embodiment of the inventive concept and an image sensor package according to a comparative example. (a) of FIG. 27 is a plot showing sensitivity depending on illuminance in an image sensor package according to a comparative example, and (b) of FIG. 27 is a plot showing sensitivity depending on illuminance in an image sensor package according to an embodiment of the inventive concept.

Referring to FIG. 27, the image sensor package according to an embodiment of the inventive concept (b) shows an improved sensitivity with respect to the same illuminance, as compared with the image sensor package according to a comparative example (a). For example, the image sensor package according to an embodiment of the inventive concept (b) may have an improved sensitivity by approximately 7%, as compared with the image sensor package according to a comparative example (a).

Figure 28:
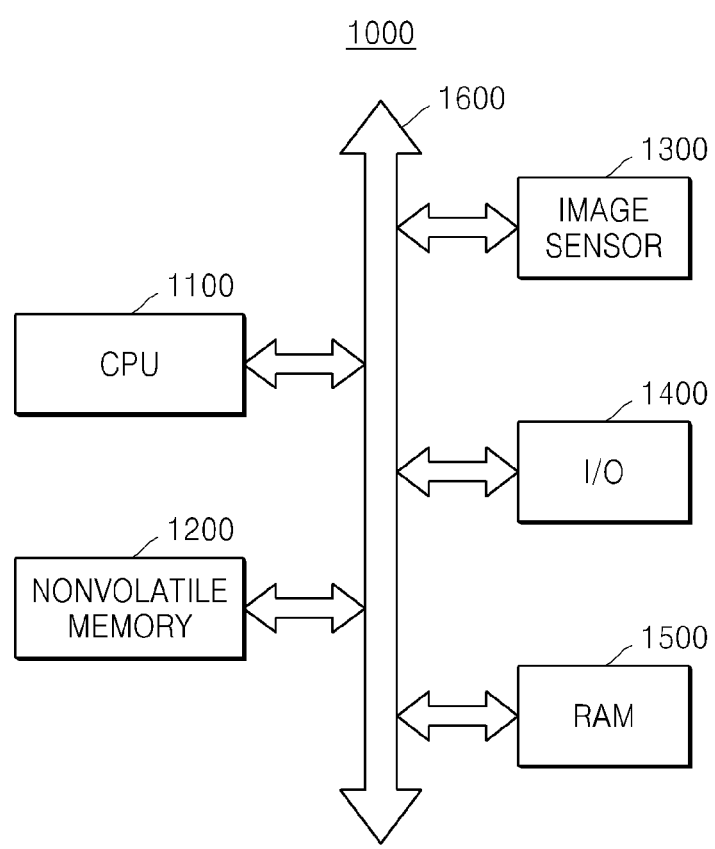
FIG. 28 is a block diagram showing a system including an image sensor package according to an embodiment of the inventive concept.

FIG. 28 is a block diagram showing a system including an image sensor package according to an embodiment of the inventive concept.

Referring to FIG. 28, a system 1000 may be any one of a computing system, camera system, a camcorder, a mobile phone, a scanner, a car navigation device, a videophone, a security system, a game machine, a medical micro camera, a robot, or a motion detection system which requires image data.

The system 1000 may include a central processing unit (or processor) 1100, a non-volatile memory 1200, an image sensor 1300, an input and output device 1400, and a RAM 1500. The central processing unit 1100 may communicate with the non-volatile memory 1200, the image sensor 1300, the input and output device 1400, and the RAM 1500 through a bus 1600. The image sensor 1300 may be configured as any one of the image sensor packages 1, 2, 3, 4, 5, 6, 7, and 8 shown in FIGS. 3 to 10, or may be configured as one semiconductor package in combination with the central processing unit 1100.

Figure 29:
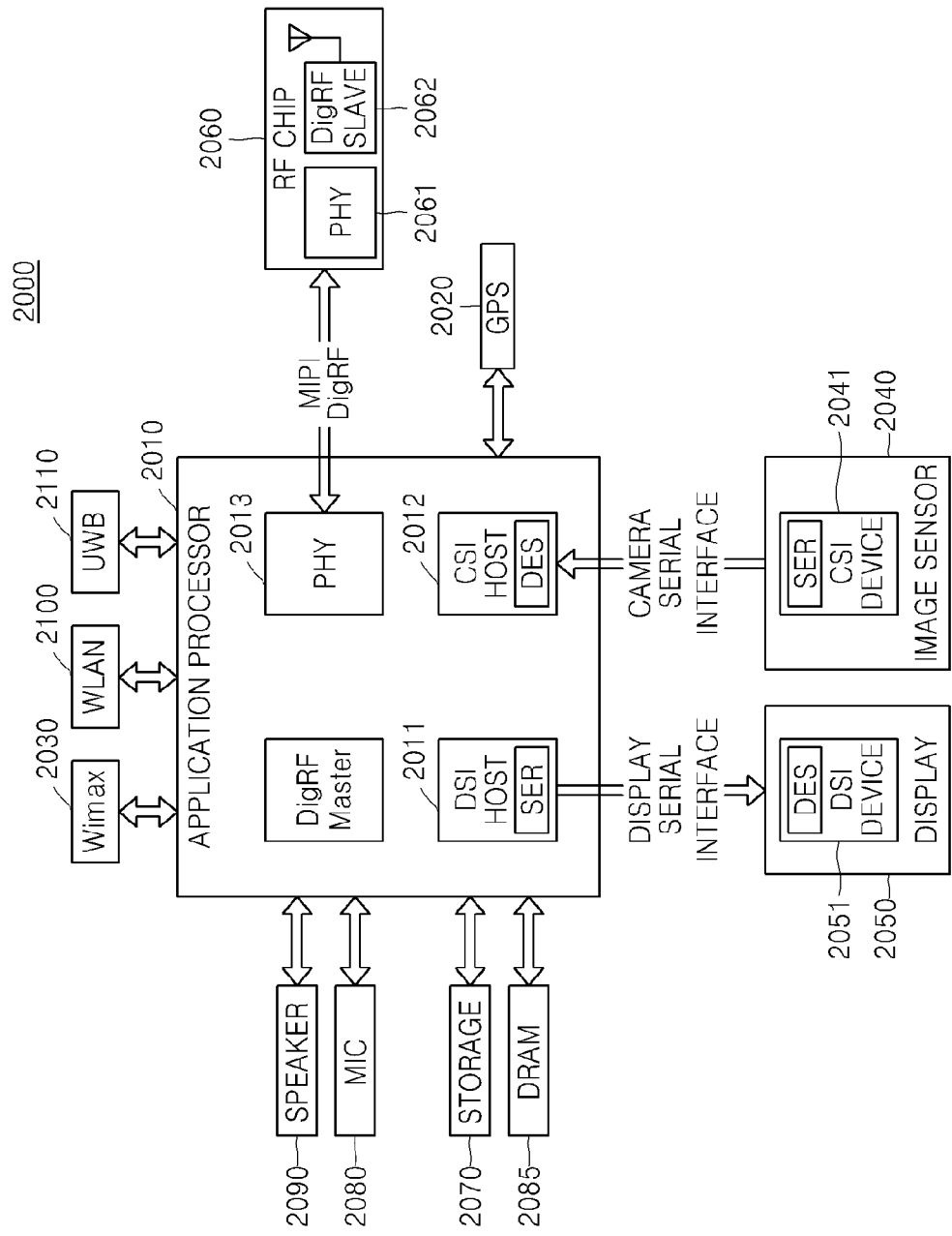
FIG. 29 shows an electronic system including an image sensor package according to an embodiment of the inventive concept.

FIG. 29 shows an electronic system 2000 including an image sensor package according to an embodiment of the inventive concept, and interfaces.

Referring to FIG. 29, the electronic system 2000 may be configured as a data processing apparatus capable of using or supporting a mipi interface, for example, a mobile phone, a personal digital assistant (PDA), or a smart phone. The electronic system 2000 may include an application processor 2010, an image sensor 2040, and a display 2050.

A camera serial interface (CSI) host 2012 configured in the application processor 2010 may serially communicate with a CSI device 2041 of the image sensor 2040 through a CSI. At this time, for example, an optical deserializer may be configured in the CSI host 2012, and an optical serializer may be configured in the CSI device 2041. The image sensor 2040 may include any one of the image sensor packages 1, 2, 3, 4, 5, 6, 7, and 8 shown in FIGS. 3 to 10.

A DSI host 2011 configured in the application processor 2010 may serially communicate with a DSI device 2051 of the display 2050 through a display serial interface (DSI). At this time, for example, an optical serializer may be configured in the DSI host 2011, and an optical deserializer may be configured in the DSI device 2051.

The electronic system 2000 may further include an RF chip 2060 capable of communicating with the application processor 2010. A PHY 2013 of the electronic system 2000 and a PHY 2061 of the RF chip 2060 may exchange data according to MIPI DigRF.

The electronic system 2000 may further include a GPS 2020, a storage 2070, a microphone 2080, a DRAM 2085, and a speaker 2090. The electronic system 2000 may perform communication by using a Wimax 2030, a WLAN 3100, a UWB 3110, and the like.

In an image sensor package according to the inventive concept, since a space filled with gas such as air is not present, the gas such as air does not thermally expand, and thus the image sensor package is not damaged. A transparent material layer having a refractive index which is greater than that of the gas such as air is filled between an image sensor chip and a transparent protection cover, differences in level of upper surfaces of microlenses may be reduced. Accordingly, the generation of diffused reflection is suppressed, and thus a flare phenomenon does not occur, which leads in an increase in sensitivity. Since a particle having mobility is not present, light incident on each unit pixel may not be distorted.

In an embodiment, a separate adhesion region for attaching the transparent protection cover onto the image sensor chip is not required, and the transparent protection cover may be attached onto the image sensor chip by using the entire area of a sensor array region. Accordingly, it is possible to minimize the size of the image sensor chip, and thus the size of the image sensor package may be reduced. Thus, the transparent protection cover may be stably attached onto the image sensor chip, thereby allowing the reliability of the image sensor package to be increased.

While the inventive concept has been particularly shown and described with reference to exemplary embodiments thereof, it will be understood that various changes in form and details may be made therein without departing from the spirit and scope of the following claims.

What is claimed is:

1. An image sensor package, comprising:
a substrate having a first surface and a second surface that are opposite to each other, the substrate including a sensor array region including a plurality of unit pixels formed in the first surface and a pad region including a pad arranged in a vicinity of the sensor array region;
a plurality of microlenses formed on the plurality of unit pixels, each microlense being formed on a corresponding unit pixel, the plurality of microlenses having a first surface that is opposite the plurality of unit pixels that has differences in levels corresponding to the plurality of microlenses;
at least two transparent material layers covering the plurality of microlenses, a first layer of the at least two transparent material layers being conformally formed on the first surface of the plurality of microlenses and having a second surface that is opposite the first surface of the plurality of microlenses, the second surface having differences in levels corresponding to differences in levels of the first surface of the plurality of microlenses; and
a transparent protection cover attached onto the plurality of microlenses with the at least two transparent material layers interposed therebetween,
wherein a second layer of the at least two transparent material layers has a refractive index that is less than a refractive index of the first layer of the at least two transparent material layers and a refractive index of the transparent protection cover.

2. The image sensor package of claim 1, wherein the at least two transparent material layers fill a space between the sensor array region of the substrate and the transparent protection cover.

3. The image sensor package of claim 1, wherein the transparent protection cover overlaps the sensor array region in a direction that is substantially perpendicular to the first surface of the substrate and exposes the pad.

4. The image sensor package of claim 1, wherein at least one of the at least two transparent material layers covers the pad.

5. The image sensor package of claim 4, wherein one of the at least two transparent material layers exposes at least a portion of the pad in a direction substantially perpendicular to the first surface of the substrate.

6. The image sensor package of claim 1, further comprising a package base substrate,
wherein the substrate is attached onto the package base substrate.

7. The image sensor package of claim 6, wherein the package base substrate has an upper surface that defines a recess, and wherein the substrate is attached to the inside of the recess.

8. The image sensor package of claim 7, wherein the first surface of the substrate has a level which is lower than that of an uppermost surface of the package base substrate.

9. The image sensor package of claim 6, further comprising:
a bonding wire connecting the pad to the package base substrate; and
an opaque resin layer surrounding the bonding wire and covering lateral sides of the substrate and the transparent protection cover.

10. The image sensor package of claim 1, further comprising a through electrode which is electrically connected to the pad and passes through the substrate to be exposed through the second surface of the substrate,
wherein the substrate and the transparent protection cover have the same area and overlap each other in a direction substantially perpendicular to the first surface of the substrate.

11. The image sensor package of claim 1, wherein an infrared shielding film is formed on a lower surface of the transparent protection cover.

12. An image sensor package, comprising:
a package base substrate;
a substrate having a first surface and a second surface that are opposite to each other, the substrate including a sensor array region including a plurality of unit pixels formed in the first surface and a pad region including a pad arranged in a vicinity of the sensor array region, and the substrate attached onto the package base substrate so that the second surface of the substrate faces the package base substrate;
a plurality of microlenses formed on the plurality of unit pixels, each microlense being formed on a corresponding unit pixel, the plurality of microlenses having a first surface that is opposite the plurality of unit pixels that has differences in levels corresponding to the plurality of microlenses;
a first transparent material layer covering the substrate and exposing at least a portion of the pad, the first transparent material layer being conformally formed on the first surface of the plurality of microlenses and having a second surface that is opposite the first surface of the plurality of microlenses, the second surface of the first transparent material layer having differences in levels corresponding to differences in levels of the first surface of the plurality of microlenses;
a second transparent material layer formed on the first transparent material layer; and
a transparent protection cover attached onto the first transparent material layer with the second transparent material layer interposed therebetween, the transparent protection cover covering an entire area of the entire sensor array region in a direction substantially perpendicular to the first surface of the substrate, and exposing the pad,
wherein the second transparent layer has a refractive index that is less that a refractive index of the first transparent material layer and a refractive index of the transparent protection cover.

13. The image sensor package of claim 12,
wherein the package base substrate has an upper surface that defines a recess, and
wherein the substrate is attached to inside of the recess so that the first surface of the substrate is positioned within the recess.

14. The image sensor package of claim 13, further comprising an opaque resin layer that covers lateral sides of the substrate and the transparent protection cover and fills the recess.

15. An image sensor package, comprising:
a package base substrate;
a substrate having a first surface and a second surface that are opposite to each other, the substrate including a sensor array region comprising a plurality of unit pixels formed in the first surface and a pad region comprising a pad arranged in the vicinity of the sensor array region, and the substrate attached onto the package base substrate so that the second surface faces the package base substrate;
a plurality of microlenses formed on the plurality of unit pixels, respectively, each microlens being formed on a corresponding unit pixel, the plurality of microlenses having a first surface that is opposite the plurality of unit pixels that has differences in levels corresponding to the plurality of microlenses;
a first transparent material layer formed on the substrate to cover the plurality of microlenses and the pad, the first transparent material layer being conformally formed on the first surface of the plurality of microlenses and having a second surface that is opposite the first surface of the plurality of microlenses, the second surface of the first transparent material layer having differences in levels corresponding to differences in levels of the first surface of the plurality of microlenses;
a second transparent material layer formed on the first transparent material layer to not cover the pad in a direction substantially perpendicular to the first surface of the substrate; and
a transparent protection cover covering the sensor array region in a direction substantially perpendicular to the first surface of the substrate with the first and second transparent material layers interposed therebetween,
wherein the second transparent layer has a refractive index that is less that a refractive index of the first transparent material layer and a refractive index of the transparent protection cover.

16. The image sensor package of claim 15, wherein substantially all of the first transparent material layer, the second transparent material layer, and the transparent protection cover overlap the sensor array region in a direction substantially perpendicular to the first surface of the substrate.

17. The image sensor package of claim 15, wherein the second transparent material layer has a refractive index that is similar to a refractive index of the microlens.

18. The image sensor package of claim 17, wherein the first transparent material layer has a refractive index that is similar to the refractive index of the microlens.

* * * * *